(12) United States Patent
Adachi

(10) Patent No.: US 7,712,806 B2
(45) Date of Patent: May 11, 2010

(54) THIN FILM FORMING APPARATUS, FILM SUPPLIER, FILM CASSETTE, TRANSPORT MECHANISM AND TRANSPORT METHOD

(75) Inventor: Hideki Adachi, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 1495 days.

(21) Appl. No.: 11/052,599

(22) Filed: Feb. 7, 2005

(65) Prior Publication Data

US 2005/0150450 A1   Jul. 14, 2005

Related U.S. Application Data

(62) Division of application No. 10/387,200, filed on Mar. 11, 2003, now Pat. No. 6,868,888.

(51) Int. Cl.
B25B 11/00       (2006.01)
(52) U.S. Cl. .............. 294/64.1; 414/752.1; 414/226.01; 414/941
(58) Field of Classification Search ................... 269/21; 248/363, 226.01; 294/64.1; 414/752.1, 941
See application file for complete search history.

(56) References Cited

U.S. PATENT DOCUMENTS

| | | | | |
|---|---|---|---|---|
| 2,559,649 A | | 7/1951 | Little et al. ................. 156/231 |
| 4,049,484 A | * | 9/1977 | Priest et al. ................. 156/285 |
| 4,787,662 A | * | 11/1988 | Dewez ........................ 294/64.1 |
| 5,192,070 A | * | 3/1993 | Nagai et al. .................... 271/90 |
| 5,709,484 A | | 1/1998 | Dorner ........................ 400/188 |
| 5,749,614 A | * | 5/1998 | Reid et al. ................. 294/64.1 |
| 5,975,740 A | | 11/1999 | Lin et al. ....................... 700/99 |
| 6,062,241 A | | 5/2000 | Tateyama et al. |
| 6,193,807 B1 | | 2/2001 | Tateyama et al. |
| 6,239,045 B1 | | 5/2001 | Tanaka et al. ................ 438/905 |
| 6,261,012 B1 | | 7/2001 | Haas et al. ................... 156/265 |
| 6,264,296 B1 | | 7/2001 | Klinefelter et al. ............. 347/4 |
| 6,533,123 B1 | | 3/2003 | Nakamura et al. |
| 6,689,245 B2 | | 2/2004 | Tsujimoto .................... 156/267 |
| 6,726,433 B1 | | 4/2004 | Blake et al. |

(Continued)

FOREIGN PATENT DOCUMENTS

JP         60-182138         9/1985

(Continued)

OTHER PUBLICATIONS

Office Action issued Jan. 8, 2008 issued for the divisional application of the basic Japanese Patent Application.

(Continued)

*Primary Examiner*—Mark A Osele
(74) *Attorney, Agent, or Firm*—Ostrolenk Faber LLP

(57) ABSTRACT

A center robot is fixed approximately in a central portion of a process part. A coating unit, a drying unit, a transfer unit, a peeling unit, a film supplying unit and a reversing unit are arranged around the center robot. The center robot comprises a hand-for-substrate and a hand-for-film which are allowed to directly access the respective units. Within a process part, the center robot transports a sheet film and/or a substrate between the coating unit, the drying unit, the transfer unit and the film supplying unit, and a thin film is formed on the substrate using the sheet film.

4 Claims, 18 Drawing Sheets

U.S. PATENT DOCUMENTS

| | | | |
|---|---|---|---|
| 2001/0014544 A1 | 8/2001 | Tanaka et al. | 438/905 |
| 2001/0026720 A1 | 10/2001 | Paulson et al. | 400/120.01 |
| 2002/0074704 A1* | 6/2002 | Goeckel et al. | 269/21 |

FOREIGN PATENT DOCUMENTS

| | | |
|---|---|---|
| JP | 61-243745 | 10/1986 |
| JP | 63-169286 | 11/1988 |
| JP | 63-267631 | 11/1988 |
| JP | 1-321257 | 12/1989 |
| JP | 7-307374 | 11/1995 |
| JP | 8-157062 | 6/1996 |
| JP | 8-207986 | 8/1996 |
| JP | 9-129719 | 5/1997 |
| JP | 10-81425 | 3/1998 |
| JP | 10-144664 | 5/1998 |
| JP | 10-316242 | 12/1998 |
| JP | 10-335284 | 12/1998 |
| JP | 11-11710 | 1/1999 |
| JP | 11-31732 | 2/1999 |
| JP | 11-040642 | 2/1999 |
| JP | 11-195690 | 7/1999 |
| JP | 2000-31071 | 1/2000 |
| JP | 2000-281172 | 10/2000 |
| JP | 2000-318850 | 11/2000 |
| JP | 2001-135634 | 5/2001 |
| JP | 2001-223196 | 8/2001 |

OTHER PUBLICATIONS

Japanese Office Action issued Sep. 11, 2007.
Japanese Office Action issued Feb. 13, 2007.
Japanese Office Action issued May 1, 2007.

* cited by examiner

FIG. 1
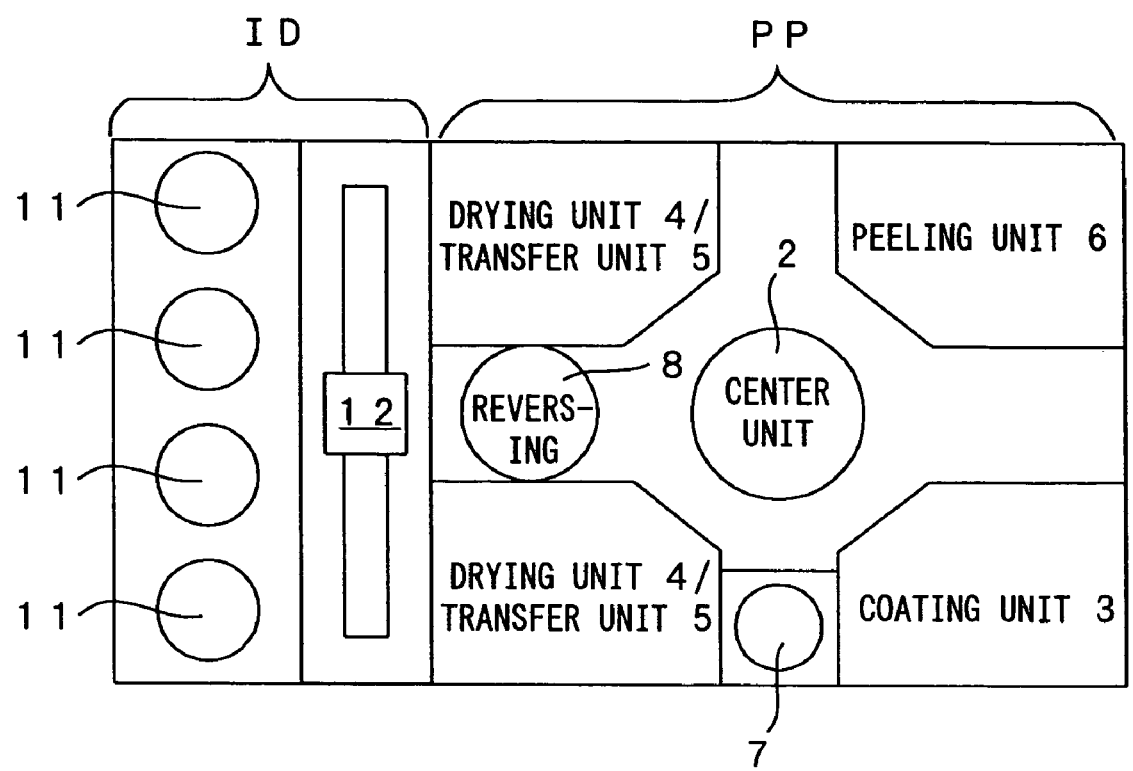
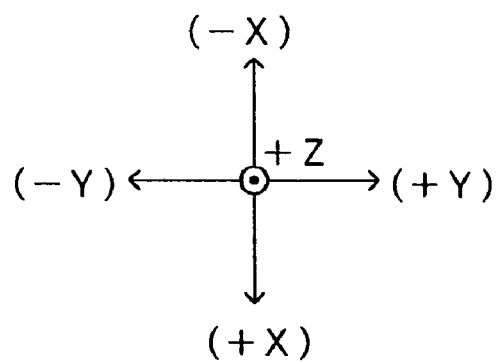

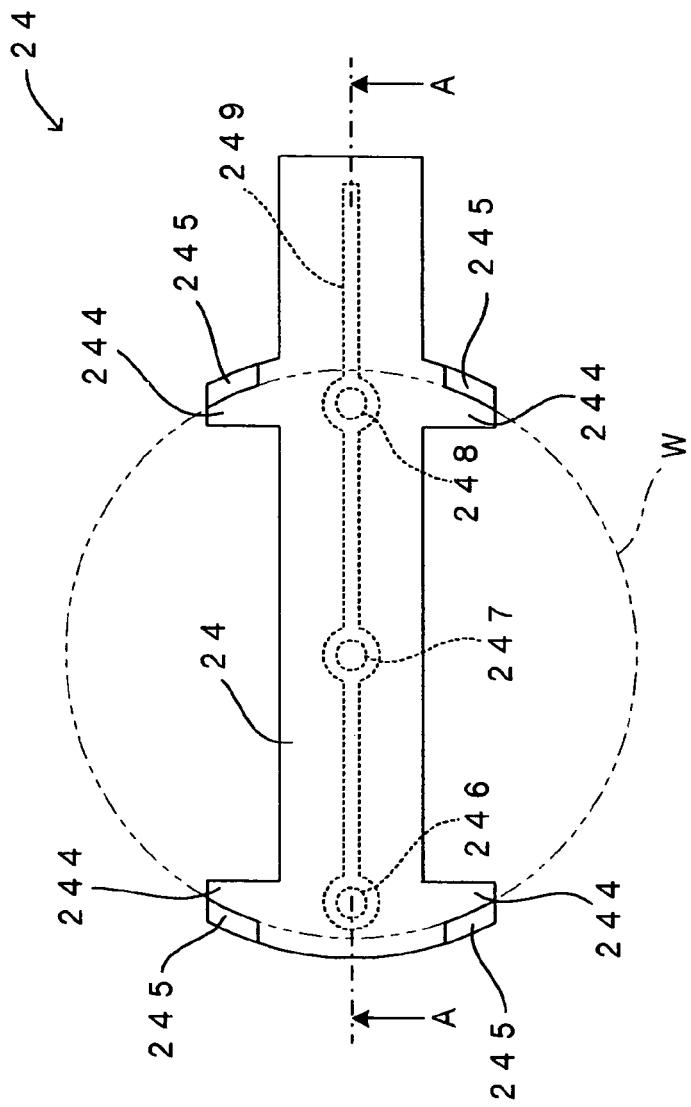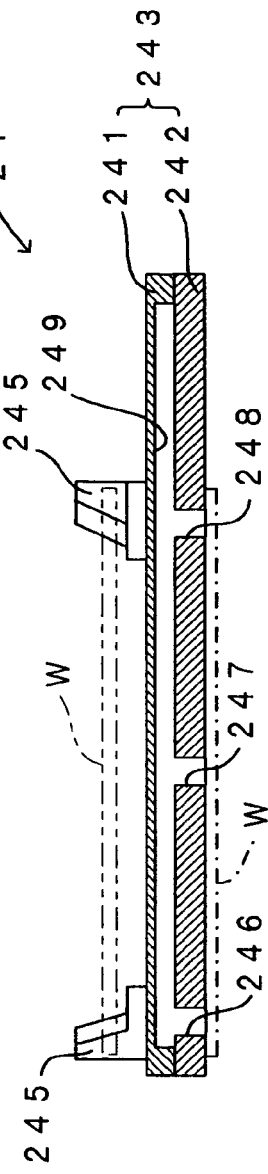

F I G. 1 6 A
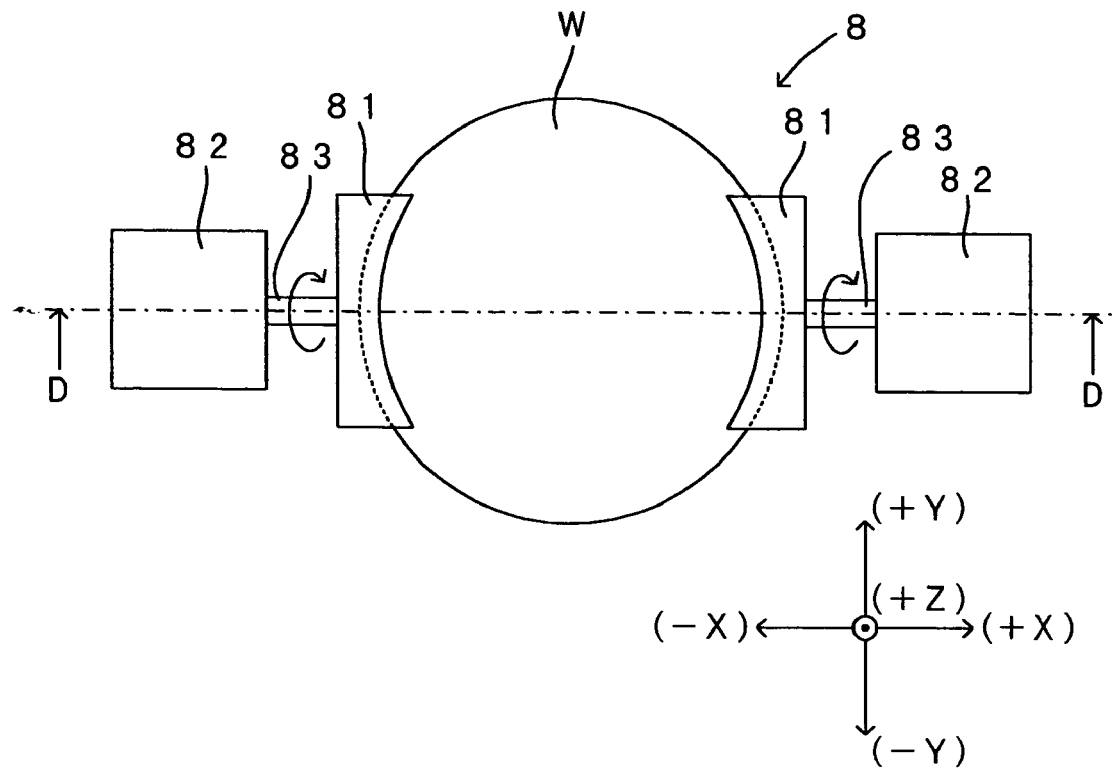
F I G. 1 6 B
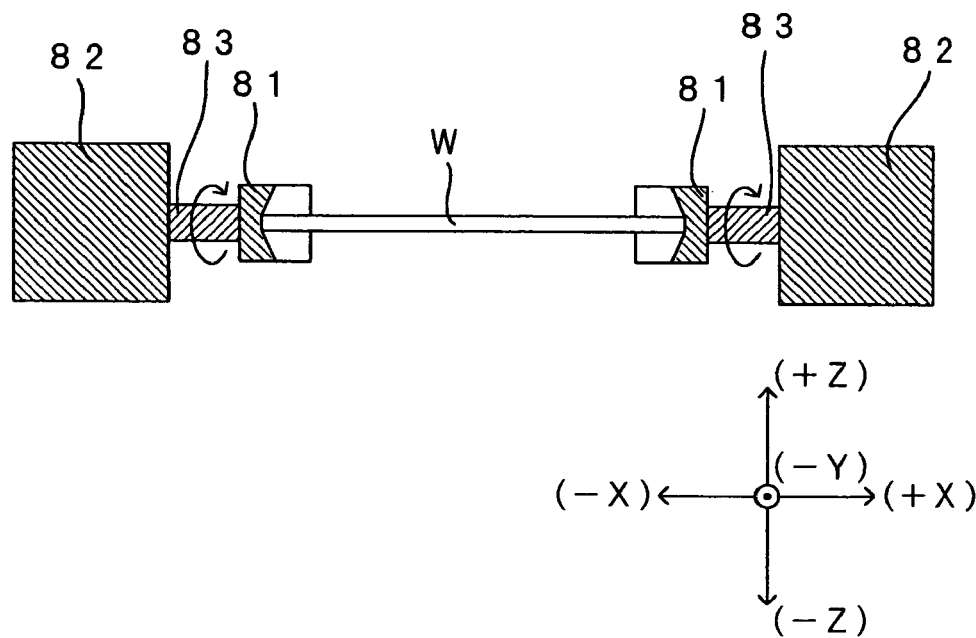

THIN FILM FORMING APPARATUS, FILM SUPPLIER, FILM CASSETTE, TRANSPORT MECHANISM AND TRANSPORT METHOD

BACKGROUND OF THE INVENTION

1. Field of the Invention

The present invention relates to a thin film forming apparatus for forming a thin film on a substrate using a sheet film, and a film supplying mechanism, a film cassette, a transportation mechanism and a transportation method which can be used in such an apparatus.

2. Description of the Related Art

Over the recent years, it has became necessary to use a thin film forming method suitably applicable to a large area size as wafers used during manufacturing of LSIs have became larger in diameter, liquid crystal panels have became larger in area size, etc. In addition, in the field of multilevel interconnection techniques among techniques for manufacturing LSIs, the surface of an insulation film needs be planarized accurately to realize multilevel interconnections. Hence, there are increasing demands for larger area sizes and better surface planarization techniques for planarization of surfaces during fabrication of thin films. In an effort to meet these demands, thin film forming techniques for forming a thin film on a substrate by a pressure transfer method have been proposed.

This type of thin film forming apparatus may be an apparatus which is described in Japanese Patent Application Laid-Open Gazette No. 2001-135634 for instance. In this apparatus, a thin film is disposed on a substrate in accordance with thin film forming steps that are shown in FIGS. 18A through 18D. First, as shown in FIG. 18A, a substrate W, such as a semiconductor wafer and a glass substrate for liquid crystal panel, is placed on a specimen holder in such a manner that electrode interconnections 111 formed on a surface of the substrate W direct themselves toward above. In this example, the surface 112 seating the electrode interconnections 111 serves as a thin film bearing surface on which a thin film is to be disposed through steps described below.

Next, as shown in FIG. 18B, a sheet film F whose surface already seats an insulation film 121 is mounted to a transfer plate which is located above the specimen holder to face the specimen holder. In this example, the insulation film 121 is the thin film that is to be transferred onto the substrate W. The insulation film 121 is located so as to face the thin film bearing surface 112 of the substrate W that is placed on the specimen holder. The specimen holder is moved toward the transfer plate and the substrate W and the sheet film F are accordingly brought into contact with each other. Thereafter, the substrate W and the sheet film F are pressed against each other as denoted at the arrows in FIG. 18B for a certain period of time while heating the substrate W to a predetermined temperature. As a result, the substrate W and the sheet film F tightly adhere to each other with the insulation film 121 inserted between the two, and a tightly adhered object is obtained.

The tightly adhered object is taken out from a thin film forming chamber and the sheet film F is peeled off as shown in FIG. 18C, whereby the substrate W which seats the insulation film 121 as that shown in FIG. 18D is obtained.

By the way, for the purpose of forming a thin film using the apparatus described above, it is necessary to retrieve a pre-transfer substrate out from a substrate cassette and place the same on a specimen holder. The other hand, it is necessary to retrieve an unused sheet film F out from a film cassette and apply a surface of the sheet film F with the insulation film 121 using a coating apparatus. Furthermore, the film F with the insulation film 121 is placed on a transfer stage of the thin film forming apparatus. It is also necessary, after transfer, to retrieve the tightly adhered object bearing the transferred thin film (which is obtained by joining the substrate W and the sheet film F through the insulation film 121) out from the thin film forming apparatus, and thereafter peel off only the sheet film F from the tightly adhered object using a peeling apparatus of the thin film forming apparatus. The sheet film F and/or the substrate W are thus transported between the respective apparatuses. The transportation of the sheet film F, the substrate W and the like is performed manually by an operator according to conventional techniques. Hence, the processing efficiency is poor, which serves as one of major causes of deterioration in throughput. This has gave rise to a strong demand for efficiently supplying of sheet films, a handling (holding/transporting) technique.

Further, once human operators handle transportation of sheet films, particles may adhere to the sheet films or heat may dissipate from the sheet films. This makes it difficult to control heat histories and leads to deterioration in product quality of thin films and even a drop in production yield, which is a problem. There is another problem that a large floor space is necessary to install the apparatus. While automated transportation of sheet films is indispensable to solve these problems, there has been no handling technique that is suitable to such automation.

SUMMARY OF THE INVENTION

The present invention has been made in light of these problems. A first object of the present invention therefore is to provide a thin film forming apparatus that is compact and makes it possible to efficiently form a thin film on a substrate using a sheet film.

A second object of the present invention is to provide a film supplier and a film cassette that, in a thin film forming apparatus for forming a thin film on a substrate using a sheet film, realizes efficient supplying of a sheet film without involving an operator.

A third object of the present invention is to provide a transport mechanism and a transportation method that, in a thin film forming apparatus for forming a thin film on a substrate using a sheet film, realizes efficient transportation of a sheet film.

The present invention is directed to an apparatus for forming a thin film on a substrate using a sheet film. To achieve the first object described above, the apparatus comprises: film supplying means which supplies a sheet film; coating means which applies a thin film coating liquid upon a surface of the sheet film supplied from the film supplying means and coats a thin film; transfer means which tightly joins the sheet film now bearing the thin film and a substrate to each other, accordingly generates a tightly adhered object and transfers the thin film onto the substrate; peeling means which peels off the sheet film from the tightly adhered object; and transporting means which transports the sheet film and/or the substrate between the film supplying means, the coating means, the transfer means and the peeling means.

According to the present invention which uses such a structure, the thin film is formed on the substrate using the sheet film while the transporting means transports the sheet film and/or the substrate between the coating means, the transfer means and the peeling means. In other words, the sheet film is transported to the coating means, the thin film is formed on the surface of the sheet film, and the sheet film is transported to the transfer means. In addition to the sheet film, the substrate is also transported to the transfer means, and the sheet film is transferred onto the substrate. At last, the peeling means peels off the sheet film, thereby completing the generation of the thin film on the substrate. In this manner, the present invention permits to form the thin film using the sheet film without involving an operator. In addition, according to the present invention, since the sheet film is supplied directly to the process part, it is possible to enhance the efficiency of transporting the sheet films and improve the throughput.

The present invention is directed to a film supplier which supplies sheet films within a thin film forming apparatus which forms thin films on substrates using the sheet films. To achieve the second object above, the film supplier comprises: a film cassette in which the sheet films are housed in such a manner that a separating sheet is inserted between the sheet films; and separating sheet removing means which removes the separating sheet located at the very top in the film cassette out from the film cassette, to thereby position the sheet film at the very top in the film cassette.

According to the present invention that uses such a structure, in the film cassette, the sheet films are housed in such a manner that a separating sheet is inserted between the sheet films. As the separating sheet comes to the very top in the film cassette, contamination of the sheet films is effectively prevented. When the separating sheet removing means removes the top-most separating sheet from the film cassette, the sheet film comes to the very top in the film cassette, and it becomes possible to unload the sheet film from the film cassette. In this manner, the sheet film is supplied in accordance with the necessity without involving an operator. The sheet films are thus efficiently supplied.

The present invention is directed to a film cassette which houses a sheet film which is used in a thin film forming apparatus which forms a thin film on a substrate. To achieve the second object above, the film cassette comprises: a cassette main body which is capable of housing a plurality of sheet films in such a manner that a separating sheet is inserted between the sheet films; and a positioning member which fits with peripheral portions of the sheet films and the separating sheet housed in the cassette main body to thereby position the sheet films and the separating sheet relative to the cassette main body.

In the film cassette having such a structure, the plurality of sheet films are housed in such a manner that the separating sheet is inserted between the sheet films. The positioning member positions the sheet films and the separating sheets relative to the cassette main part, which makes it possible to unload the sheet films from and supply the sheet films to the cassette main part without fail.

The present invention is also directed to a transport mechanism that transports a sheet film that is used in a thin film forming apparatus which forms a thin film using the sheet film. To achieve the third object above, the transport mechanism comprises: a hand-for-film which comprises a suction hole in an abutting area where the hand-for-film abuts on the sheet film; a blower which is linked to the suction hole via an inner space created inside the hand-for-film and which evacuates the inside of the inner space so that the hand-for-film sucks and accordingly holds the sheet film; and a driver-for-film which moves the hand-for-film in a condition that the blower makes the hand-for-film sucks and accordingly holds the sheet film, to thereby transport the sheet film.

According to the present invention that uses such a structure, as the blower evacuates the inner space, the sheet film is sucked and accordingly held at the suction hole of the hand-for-film. The sheet film is transported as it is thus sucked and accordingly held. In this manner, since the suction holding is realized by means of the blower evacuation, that is, since the exhaust flow rate is increased and a negative pressure is applied upon the suction hole, even if there is a leakage locally in the exhaust path from the suction hole to the blower, it is possible to develop a sufficient negative pressure to suck and accordingly hold the sheet film although the negative pressure decreases in an amount equivalent to the leakage. While a conventional method is available according to which vacuum suction is achieved by application of a negative pressure upon a suction hole by means of vacuum suction means, such as a vacuum pump and an aspirator, which serves as suction holding means, if there is a leakage locally in the exhaust path, a negative pressure is not applied upon the suction hole and vacuum suction of even the sheet film becomes impossible. Thus, suction holding by blower evacuation is proper to suck and hold the sheet film which is light very much as compared with the substrate. A transport mechanism using this structure can transport the sheet films with excellent stability, and hence, transport the sheet films efficiently.

The present invention is further directed to a transport mechanism that transports a substrate while holding the substrate. To achieve the third object above, the transport mechanism comprises: a hand main body; an upper side holding mechanism which holds the substrate on the top surface side of the hand main body; a lower side holding mechanism which holds the substrate on the bottom surface side of the hand main body; and a driver-for-substrate which moves the hand main body so as to transport the substrate.

According to the present invention which uses such a structure, the transport mechanism can transport the substrate while holding the substrate in the two holding conditions, switch the holding condition depending on the state of the substrate. The transport mechanism therefore can be adaptable to the states of the substrates and efficiently transport the substrates.

The present invention is further directed to a method of transporting a substrate by means of a transport mechanism that comprises a hand main body. To achieve the third object above, the transporting method comprises a first transportation mode, in which a substrate is transported while held on the top surface side of the hand main body; and a second transportation mode, the substrate is transported while held on the bottom surface side of the hand main body. And the substrate is transported in either one of the first transportation mode and the second transportation mode in accordance with the state of the substrate. Hence, it is possible to switch the holding condition depending on the state of the substrate, which realizes adaptation to the states of the substrates and efficient transportation of the substrates.

The above and further objects and novel features of the invention will more fully appear from the following detailed description when the same is read in connection with the accompanying drawing. It is to be expressly understood, however, that the drawing is for purpose of illustration only and is not intended as a definition of the limits of the invention.

BRIEF DESCRIPTION OF THE DRAWINGS

FIG. 1 is a layout drawing which shows a preferred embodiment of a thin film forming apparatus according to the present invention;

FIGS. 3A and 3B are drawings which show a structure of a hand-for-substrate which forms the center robot shown in FIGS. 2A and 2B;

FIGS. 16A and 16B are drawings which show a structure of a reversing unit which is disposed to the thin film forming apparatus shown in FIG. 1;

DETAILED DESCRIPTION OF THE PREFERRED EMBODIMENTS

A. Layout of the Apparatus

Figure 2A:
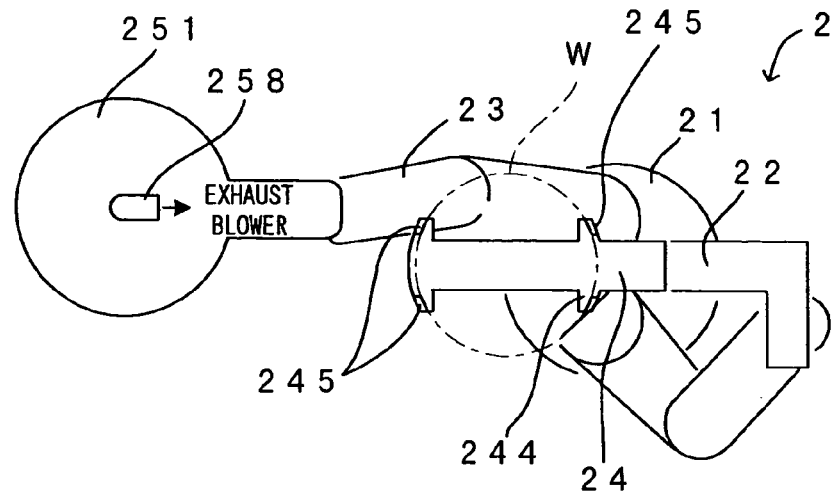
FIGS. 2A and 2B are diagrams which show a center robot.

FIG. 1 is a layout drawing which shows a preferred embodiment of a thin film forming apparatus according to the present invention. In this thin film forming apparatus, as shown in FIG. 1, there are an indexer ID disposed on stage left (the left-hand side in FIG. 1) and a process part PP, which forms a thin film on a substrate using a sheet film, disposed on stage right (the right-hand side in FIG. 1) as viewed from the indexer ID.

In the indexer ID, four substrate cassettes 11 in which substrates are housed are arranged in one line along an X-direction. A substrate transporting robot 12, which is customarily in a frequent use, moves along the direction of arrangement X. The robot 12 unloads a substrate that does not yet seat a thin film and housed in one of the substrate cassettes 11 and transports the substrate to the process part PP. The robot 12 also receives a substrate now seating a thin film from the process part PP and houses the substrate back in the substrate cassette 11. For convenience of description, each drawing herein referred to shows an orthogonal coordinate system XYZ in which a "Y-direction" is a direction which is perpendicular to a vertical direction Z and the direction of arrangement X of the substrate cassettes 11.

In the process part PP which is positioned on the (+Y)-side to the indexer ID, a coating unit 3, drying units 4, transfer units 5, a peeling unit 6, a film supplying unit 7 and a reversing unit 8 are disposed around the center robot 2. This embodiment uses two transfer units 5, for the purpose of parallel transfer by means of the transfer units 5. Further, in order to reverse a substrate received from the indexer ID by the reversing unit 8 and transport the substrate to either one of the transfer units 5 as described later, the transfer units 5 and the reversing unit 8 are disposed along the X-direction in an area of the process part PP adjacent to the indexer ID, with the reversing unit 8 inserted between the two transfer units 5. The drying units 4 are disposed over the transfer units 5, thereby reducing the footprint of the apparatus. Further, within the process part PP, on the opposite side to the indexer ID, the coating unit 3 and the peeling unit 6 are arranged. The film supplying unit 7 for supplying a sheet film is inserted between the coating unit 3 and one transfer unit 5. In this manner, the units 3 through 8 are radially arranged about the center robot 2 in the process part PP. As described in the following, the center robot 2 extends or contracts hands while fixed approximately at the center of the process part PP. On extending or contracting a hand-for-substrate, the center robot 2 transports a substrate between the transfer units 5, the peeling unit 6 and the reversing unit 8. On extending or contracting a hand-for-film, the center robot 2 transports a sheet film between the coating unit 3, the drying units 4, the transfer units 5 and the film supplying unit 7.

B. Center Robot (Transport Mechanism) 2

Figure 2B:
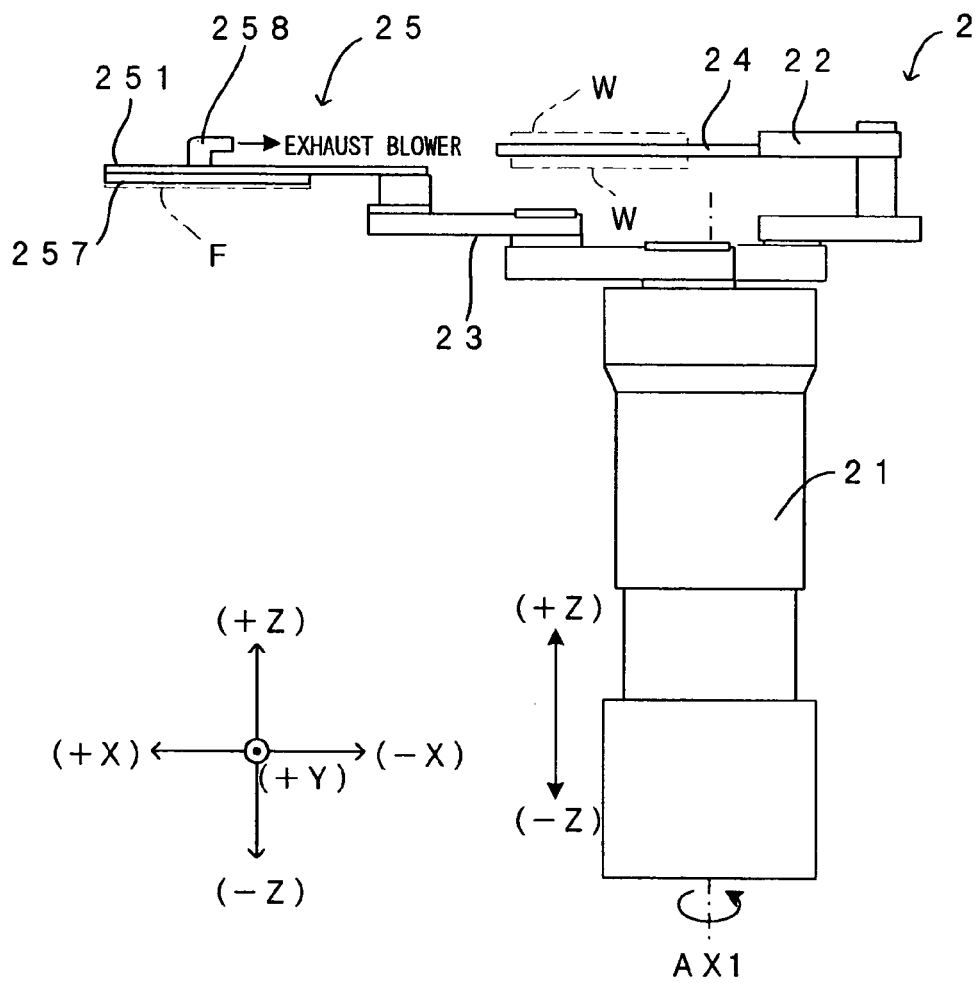

FIGS. 2A and 2B are diagrams which show the center robot, of which FIG. 2A is a plan view from above and FIG. 2B is a side view. The center robot 2 is a polyarticular robot which corresponds to a transport mechanism according to the present invention. The robot 2 comprises a robot main body 21 and two polyarticular arms 22 and 23 which are attached to a top portion of the robot main body 21. The robot main body 21, being fixed in a central portion of the process part PP, rotates about a rotation axis AX1. Further, the robot main body 21 is capable of freely extending and contracting along the Z-direction.

A hand-for-substrate 24, which functions as a substrate holder for holding the substrate W, is disposed to a front edge of the polyarticular arm 22. Driving for extending and contracting the polyarticular arm 22 is controlled in accordance with an operation instruction from a control unit (denoted at 9 in FIG. 12 which will be described later) which controls the apparatus as a whole. Driving for rotations of the robot main body 21 about the rotation axis AX1 along the Z-direction is also controlled in accordance with an operation instruction from a control unit. By controlling the operation of the robot main body 21 and the polyarticular arm 22, the hand-for-substrate 24 unloads the substrate W from the respective units 5, 6 and 8 or loads the substrate W held by the hand-for-substrate 24 to the respective units 5, 6 and 8. Thus, in this embodiment, the robot main body 21 and the polyarticular arm 22 function as a driver-for-substrate which moves the hand-for-substrate 24, which corresponds to the "holder-for-substrate" of the present invention, to thereby transport the substrate W.

FIGS. 3A and 3B are drawings which show a structure of the hand-for-substrate, of which FIG. 3A is a plan view showing the hand-for-substrate from above and FIG. 3B is a cross sectional view of FIG. 3A taken along the A-A line. The hand-for-substrate 24 comprises a hand main body 243 which is obtained by setting two plates 241 and 242 one atop the other, as shown in FIGS. 3A and 3B. There are wings 244, which extend in a direction which is approximately perpendicular to the longitudinal direction of the hand main body 243, disposed in a front edge portion and a central portion of the hand main body 243. Substrate supporting blocks 245 are fixed in top surface portions of the wings 244. As denoted at the double-dot line in FIGS. 3A and 3B, when the substrate W is fit with the substrate supporting blocks 245 on an outer side surface of the substrate W, the substrate W is mechanically held on the top surface side of the hand main body 243. Thus, in this embodiment, the substrate supporting blocks 245 function as an "upper side holding mechanism" of the present invention.

Three suction holes 246 through 248 are formed in a central portion of the bottom plate 242, while a groove portion 249 is formed on the bottom surface side of the top plate 241. When the top and the bottom plates 241 and 242 are integrated with each other, the groove portion 249 links the three suction holes 246 through 248 to each other. The groove portion 249 is connected with a vacuum suction mechanism not shown such as a vacuum pump. When the vacuum suction mechanism is activated, a negative pressure is applied upon the groove portion 249, whereby the substrate W is held by suction on the bottom surface side of the hand main body 243 as denoted at the dotted line in FIG. 3B. Thus, in this embodiment, the suction holes 246 through 248, the groove portion 249 of the hand main body 243 and the vacuum suction mechanism function as a "lower side holding mechanism" of the present invention.

As described above, in this embodiment, it is possible to transport the substrate W while holding the substrate mechanically on the upper side or holding the substrate by suction on the lower side, adapt to the state of the substrate and efficiently transport the substrate. Further, it is possible to transport the two substrates W at the same time.

The hand-for-film 25, which holds the sheet film F by suction at a surface peripheral portion of the sheet film F, is attached to a front edge portion of the other polyarticular arm 23. Driving for extending and contracting the polyarticular arm 23 is controlled in accordance with an operation instruction from the control unit. By controlling the operation of the robot main body 21 and the polyarticular arm 23, the sheet film F is unloaded from the respective units 3 through 5 and 7 or the sheet film F held by the hand-for-film 25 is loaded to the respective units 3 through 5. Thus, in this embodiment, the robot main body 21 and the polyarticular arm 23 function as a driver-for-film which moves the hand-for-film 25, which corresponds to the "film holder" of the present invention, to thereby transport the sheet film F.

Figure 4A:
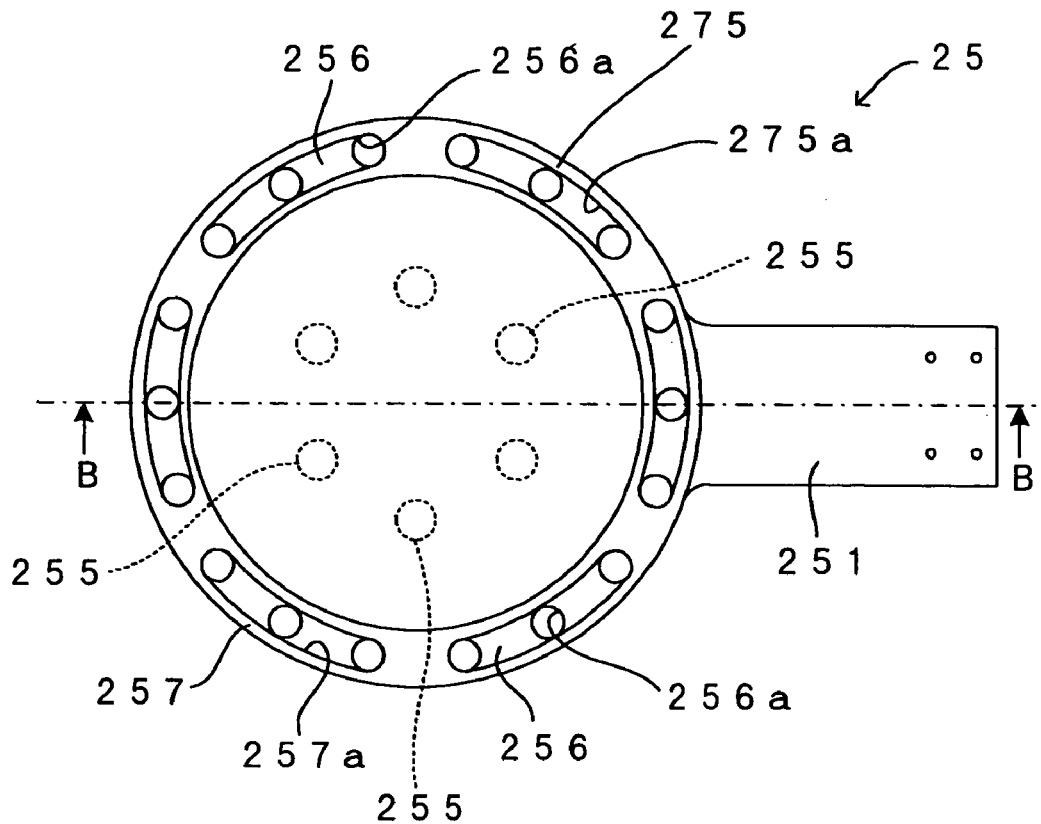
FIGS. 4A and 4B are drawings which show a structure of a hand-for-film which forms the center robot shown in FIGS. 2A and 2B.
Figure 4B:
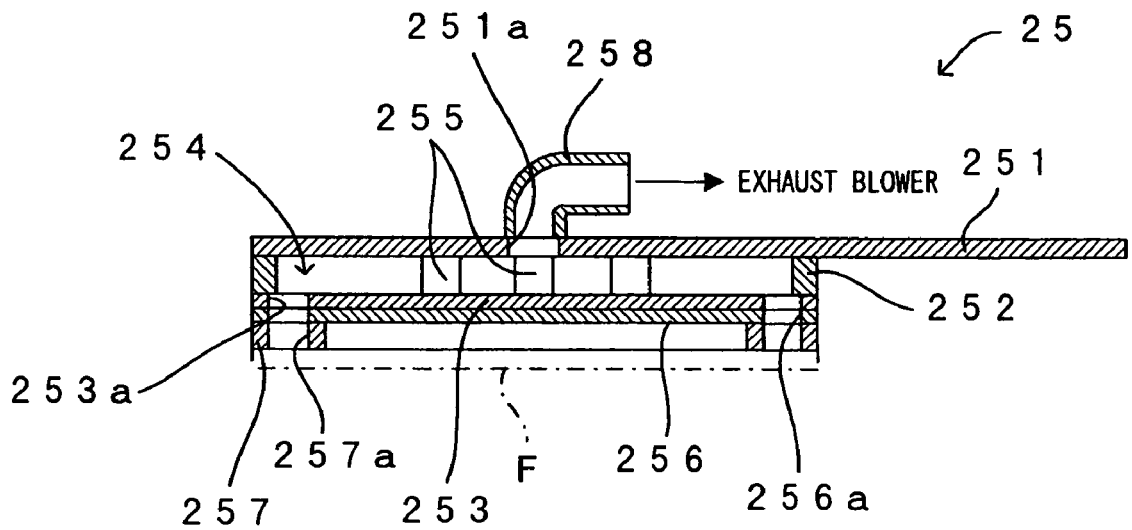

FIGS. 4A and 4B are drawings which show a structure of the hand-for-film, of which FIG. 4A is a bottom view of the hand-for-film as viewed from below and FIG. 4B is a cross sectional view of FIG. 4A taken along the B-B line. In the hand-for-film 25, a ring member 252, whose outer diameter is approximately the same as that of the sheet film F, is attached to a front edge portion on the bottom surface of a hand main body 251 while a plate member 253, whose shape is approximately the same as that of the sheet film F, is attached to the bottom surface side of the ring member 252, whereby the hand main body 251 and the ring member 252 form an inner space 254. In order to strengthen central portions of the hand main body 251 and the plate member 253, six supporting members 255 are disposed in the inner space 254.

In a peripheral edge portion of the plate member 253, there are 18 through holes 253a. A ring plate 257, whose outer diameter is approximately the same as that of the sheet film F, is attached to the plate member 253 through a packing sheet 256 which is of rubber, a resin or the like. In the packing sheet 256, there are through holes 256a formed in such a manner that the through holes 256a correspond one each to each through hole 253a of the plate member 253. In the ring plate 257, there are six suction holes 257a over three through holes 253a in such a manner that the suction holes 257a correspond one each to three through holes 253a. Thus, via the suction holes 257a and the through holes 256a and 253a, the bottom surface side of the ring plate 257 and the inner space 254 are linked to each other.

A communicating hole 251a is formed in the top surface of the hand main body 251 and connected to an exhaust blower (not shown) through an exhaust duct 258, as shown in FIG. 4B. A negative pressure is applied upon the inner space 254 as the exhaust blower operates, and as shown in FIG. 4B, as the entire bottom surface of the ring plate 257 serves as an "abutting area" of the present invention and abuts on a surface peripheral portion of the sheet film F, the sheet film F is sucked at the surface peripheral portion of the sheet film F and accordingly held.

C. Film Supplying Unit (Film Supplier) 7 and Film Cassette 71

Figure 5:
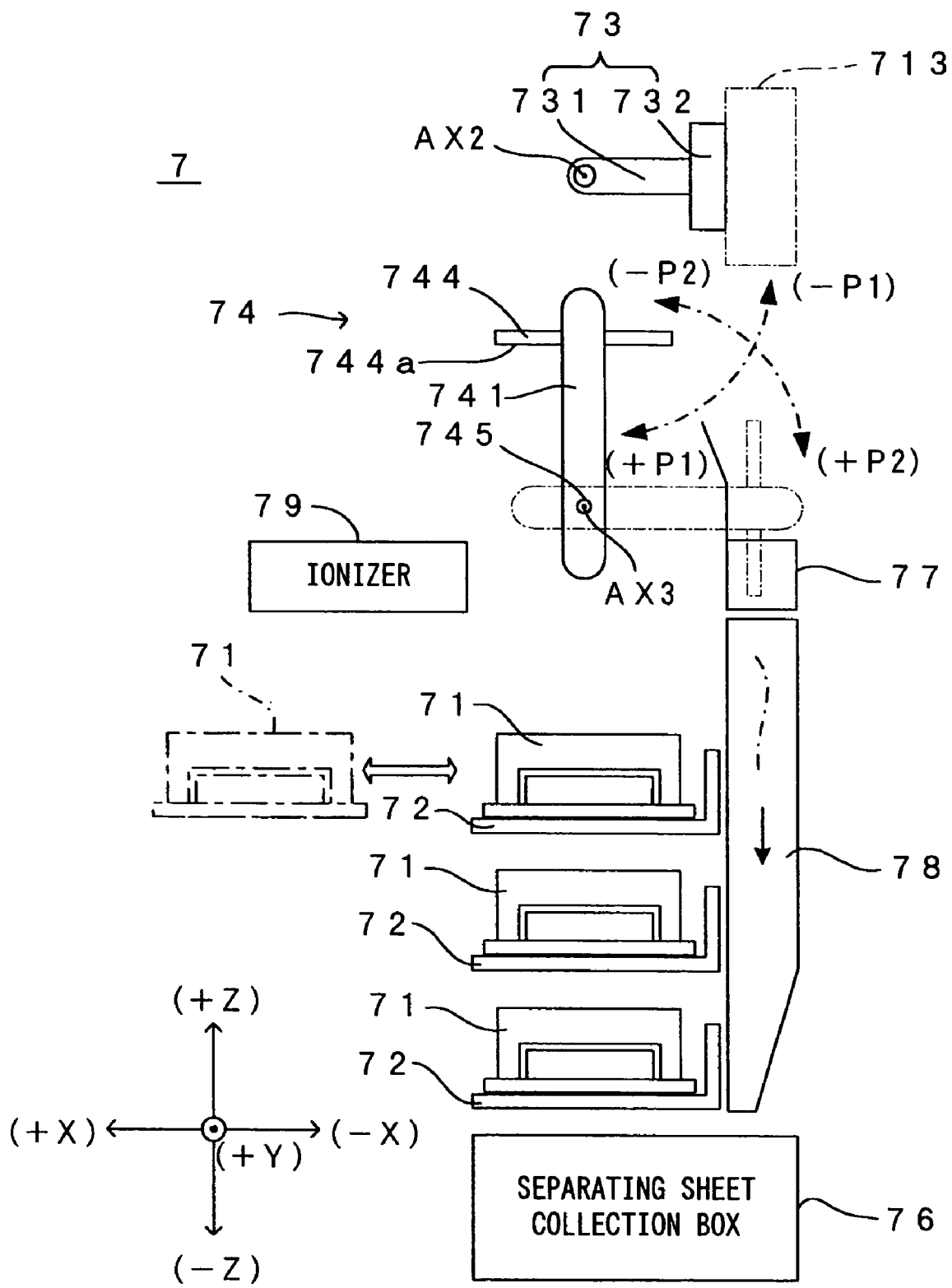
FIG. 5 is a drawing which shows a structure of a film supplying unit which is disposed to the thin film forming apparatus shown in FIG. 1.

FIG. 5 is a drawing which shows a structure of the film supplying unit which is disposed to the thin film forming apparatus shown in FIG. 1. In this film supplying unit 7, a film cassette 71 in which the sheet films F are housed is freely attachable to and detachable from a cassette seater 72. The cassette seater 72 is moved upward and downward in the vertical direction Z by an elevating mechanism not shown, thereby positioning the film cassette 71 mounted to the cassette seater 72 in the vertical direction Z. In this embodiment, as shown in FIG. 5, there are three cassette seaters 72, which allows to mount maximum of three film cassettes 71 at the same time. The number of the cassette seaters 72 is not limited to "three" but may be any desired number.

Figure 6:
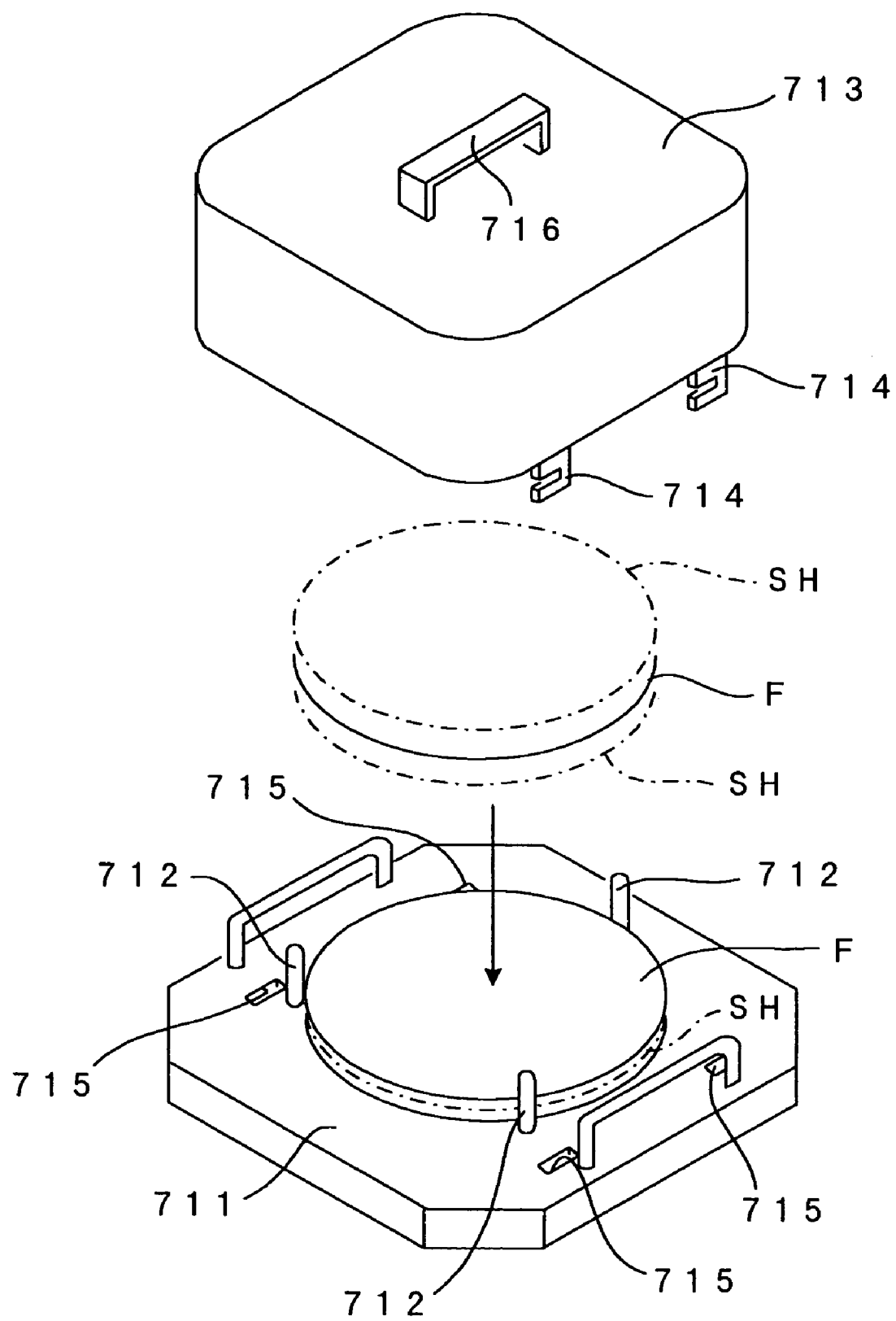
FIG. 6 is a perspective deal/assembly drawing of a film cassette which is disposed to the thin film forming apparatus shown in FIG. 1.

FIG. 6 is a perspective deal/assembly drawing of the film cassette which is disposed to the thin film forming apparatus shown in FIG. 1. Each film cassette 71 is capable of housing a plurality of sheet films F into a cassette main body 711, with a separating sheet SH inserted between the sheet films F. Three positioning pins 712 are disposed upright to the cassette main body 711. The positioning pins 712 fit with peripheral portions of the sheet films F and the separating sheets SH which are housed in the cassette main body 711, whereby the sheet films F and the separating sheets SH are positioned relative to the cassette main body 711. Hence, inside the cassette main body 711, the sheet films F and the separating sheets SH are always housed as they are aligned, which in turn permits to execute unloading of the sheet films F, removal of the separating sheets SH and other processing which will be described later each in an excellent manner.

A protection cover 713 is disposed to the cassette main body 711 in such a manner that the protection cover 713 can freely open and close. Describing in more detail, projections 714 are attached to the protection cover 713 at four positions in a bottom edge peripheral portion of the protection cover 713, and insertion holes 715 are formed in the cassette main body 711 to correspond to the respective projections 714. When the protection cover 713 is mounted to the cassette main body 711 while inserting each projection 714 into each corresponding insertion hole 715, the protection cover 713 is closed, thereby covering the sheet films F and the separating sheets SH which are housed in the cassette main body 711 from above and accordingly protecting the sheet films F and the separating sheets SH. This prevents contamination of the sheet films F without fail. On the other hand, as the protection cover 713 is moved toward above away from the cassette main body 711, the protection cover 713 is opened, thereby allowing to unload the sheet films F and the separating sheets SH which are housed in the cassette main body 711 from above.

Figure 8A:
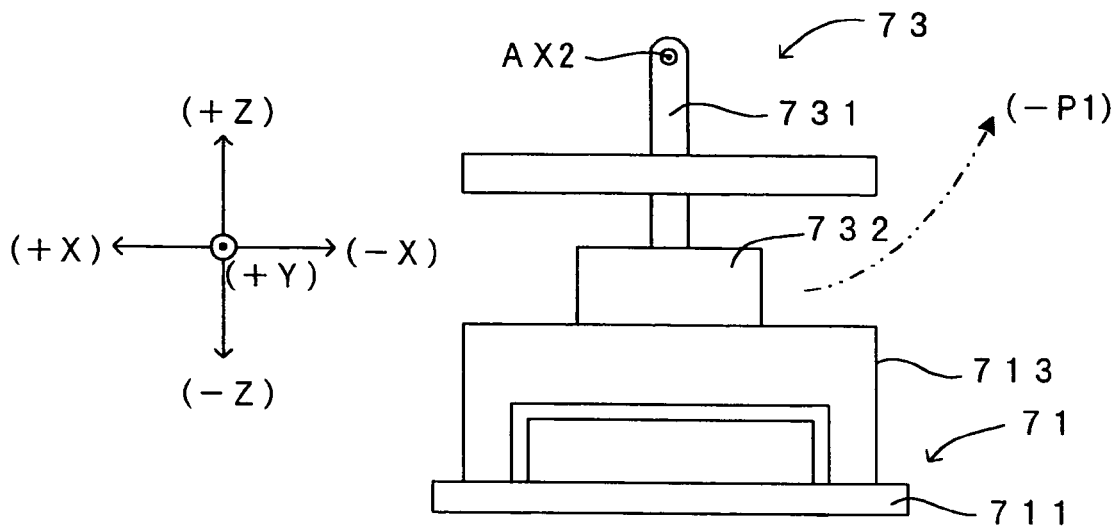
FIGS. 8A through 8C are diagrams which show operations of the film supplying unit shown in FIG. 5.

In order to move the protection cover 713 to open and close the protection cover 713, in the film supplying unit 7 according to the embodiment, as shown in FIG. 5, a cover open/close driving mechanism 73 is disposed at a position above the cassette seaters 72. The cover open/close driving mechanism 73 comprises a revolving arm 731 which can freely revolve about a revolution axis AX2 and a grip 732 which is attached to a front edge of the revolving arm 731. Driven by a driver not shown, the revolving arm 731 revolves along the direction denoted at the dotted line arrow P1. After the grip 732 grasps a handle 716 which is disposed to the protection cover 713 for the film cassettes 71 positioned at predetermined cover open/close positions (FIG. 8A), the cover open/close driving mechanism 73 causes the revolving arm 731 to revolve along the (−P1)-direction and move to a retracted position which is shown in FIG. 5. An operation opposite to this is performed to close the protection cover 713.

Figure 7:
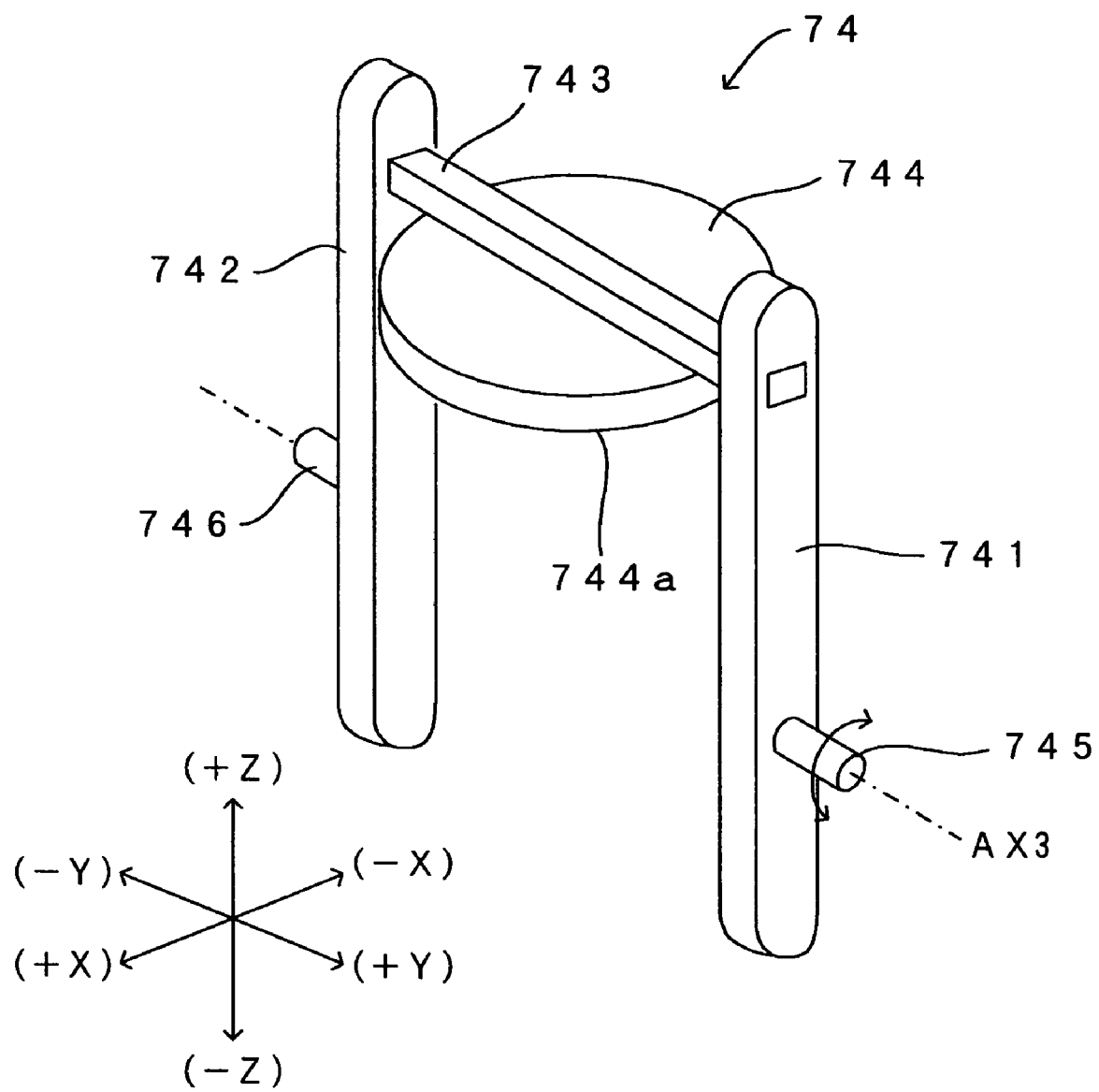
FIG. 7 is a perspective drawing of a separating sheet removing mechanism which is disposed to the film supplying unit shown in FIG. 5.
Figure 8B:
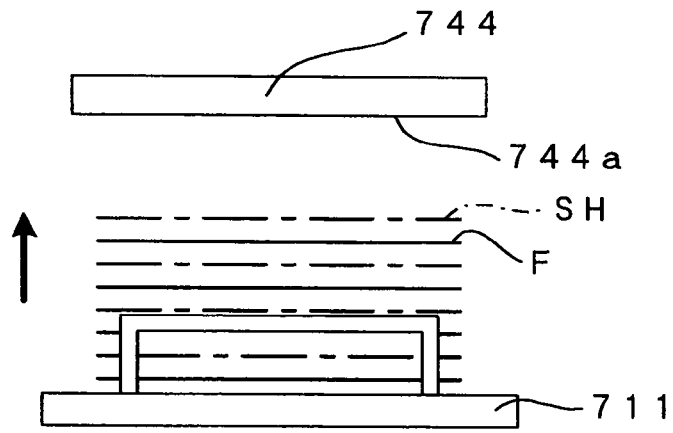
Figure 8C:
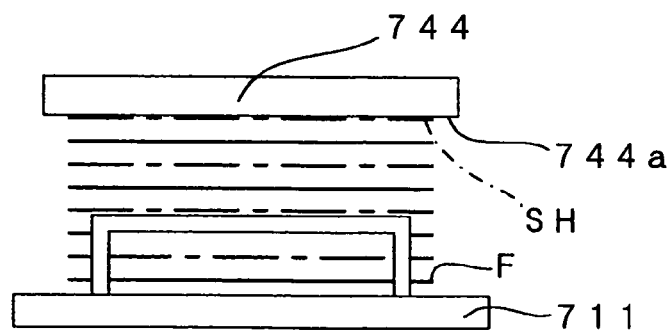

At a position below the cover open/close driving mechanism 73, a separating sheet removing mechanism 74 is disposed to remove the separating sheets SH. In the separating sheet removing mechanism 74, as shown in FIGS. 5 and 7, two revolving arms 741 and 742 are disposed with a gap between the two. The gap is wider than the outer diameter of the sheet films F and the separating sheets SH. Further, there is a communicating beam 743 which extends in the horizontal direction, disposed to top portions of the revolving arms 741 and 742. A suction plate 744 for sucking the separating sheets SH is attached to a central portion of the communicating beam 743, and as shown in FIGS. 5 and 7, the bottom surface of the suction plate 744 serves as a suction surface 744a at a suction position. As the cassette seater 72 is moved upward while the suction surface 744a is directed to the (−Z)-direction as shown in FIG. 8B, the top-most separating sheet SH in the film cassette 71 set to the cassette seater 72 abuts on the suction surface 744a and is sucked and accordingly held by the suction plate 744 as shown in FIG. 8C. The distances between the film cassettes 71 set to the cassette seaters 72 are long enough for the protection cover 713 to move passed during attachment or detachment of the protection cover 713 by the cover open/close driving mechanism 73.

Figure 9A:
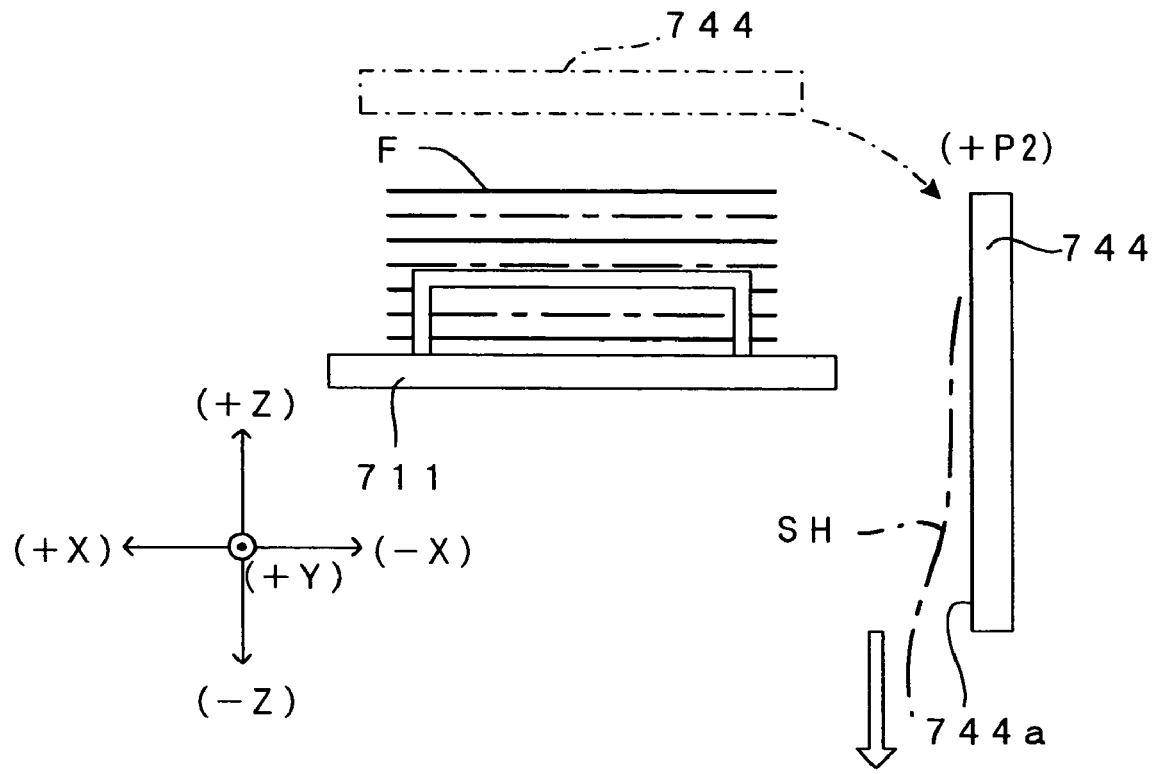
FIGS. 9A and 9B are diagrams which show operations of the film supplying unit shown in FIG. 5.

Axial members 745 and 746 extending in the (+Y)-direction and the (−Y)-direction, respectively, are attached respectively to the revolving arms 741 and 742 and can freely revolve about a revolution axis AX3, as shown in FIG. 7. Driven by a driver not shown, the revolving arms 741 and 742 revolve along the direction denoted at the dotted line arrow P2. Hence, after the suction plate 744 sucks and accordingly holds the separating sheet SH as described above, when the revolving arms 741 and 742 revolve along the direction (+P2) denoted at the arrow as shown in FIG. 9A, the suction plate 744 is positioned to a removal position. When the suction by the suction plate 744 is released, the separating sheet SH drops toward below from the suction plate 744.

In this embodiment, a separating sheet collection box 76 for collecting the separating sheets SH is disposed to a bottom surface portion of the film supplying unit 7. Guide members 77 and 78 are disposed which guide the separating sheet SH dropping as described above into the separating sheet collection box 76. Thus, the separating sheet collection box 76 and the guide members 77 and 78 constitute a "separating sheet collection means" of the present invention, and it is possible to collect the separating sheets SH into the separating sheet collection box 76 without fail. This effectively prevents the separating sheets SH from scattering around the film supplying unit 7.

Figure 9B:
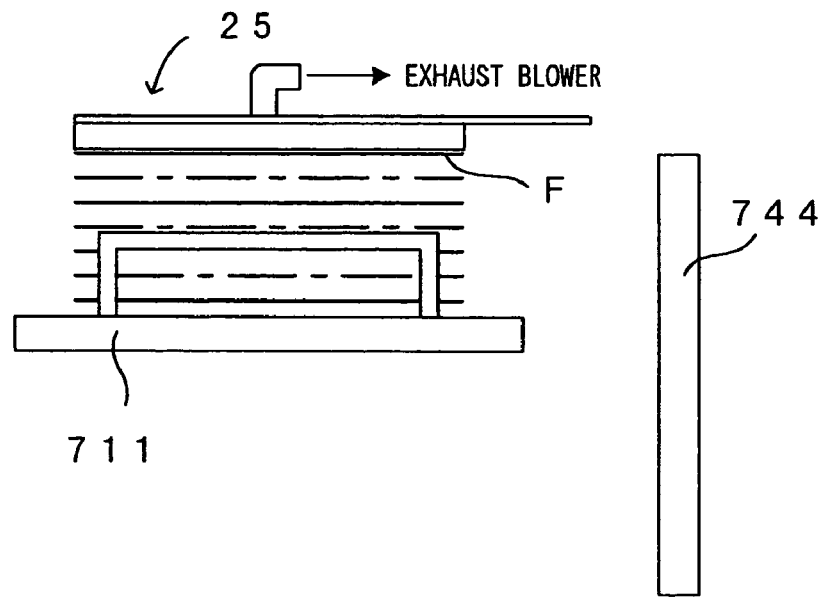

On the other hand, with the separating sheet SH removed from the film cassette 71, the sheet film F is exposed in the top-most portion and therefore can be unloaded from the film cassette 71. The hand-for-film 25 moves to the film supplying unit 7 at appropriate timing, and sucks and accordingly holds the top-most sheet film F (FIG. 9B). The sheet film F is then transported to the next processing unit, namely, the coating unit 3.

According to this embodiment, an ionizer 79 is disposed in the vicinity of the separating sheet removing mechanism 74 as shown in FIG. 5 which effectively prevents development of peeling-inducing electrification during unloading of the sheet films F and removal of the separating sheets SH from the film cassettes 71.

D. Coating Unit 3

Figure 10:
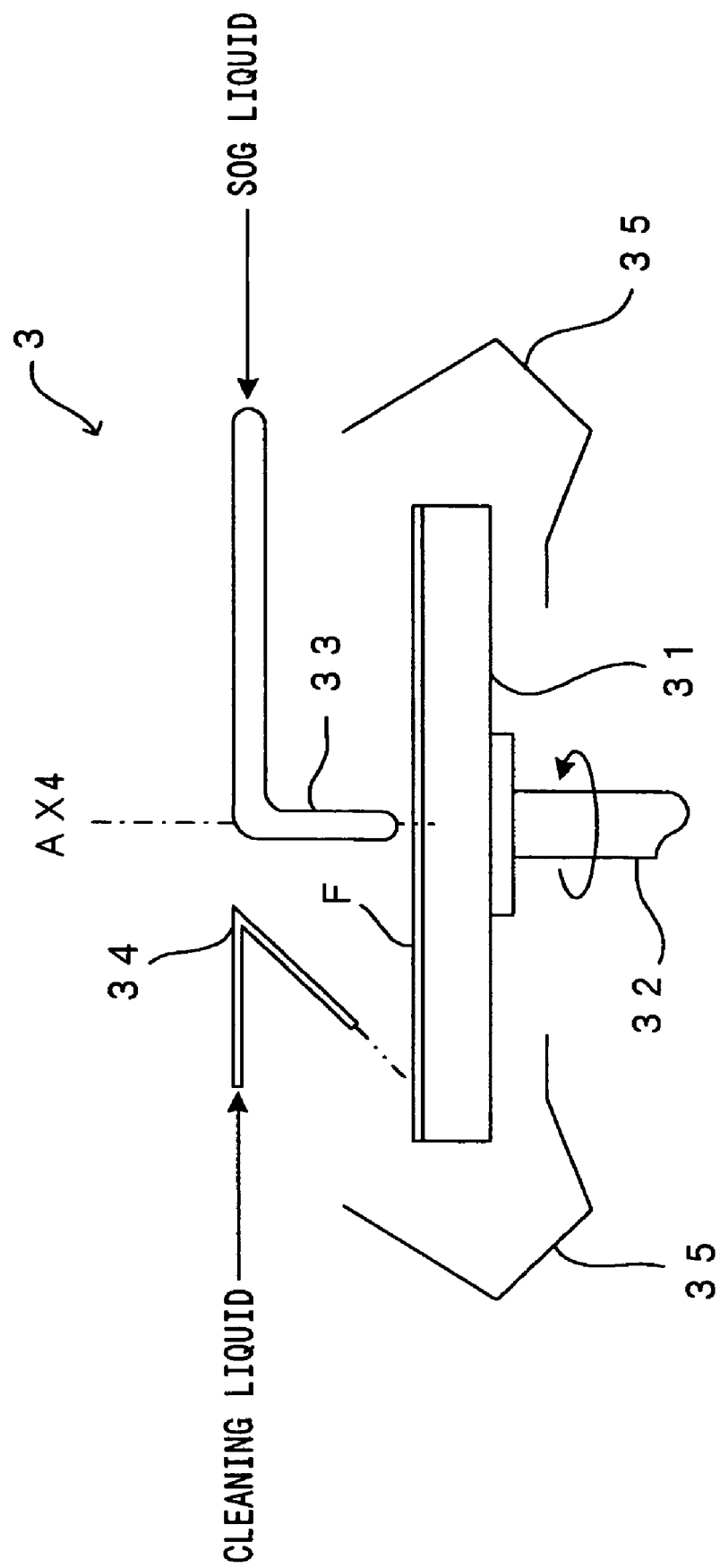
FIG. 10 is a drawing which shows a structure of a coating unit which is disposed to the thin film forming apparatus shown in FIG. 1.

FIG. 10 is a drawing which shows a structure of the coating unit which is disposed to the thin film forming apparatus shown in FIG. 1. The coating unit 3 comprises: a disk-shaped stage 31; a rotation axis 32 of a motor (not shown) which rotates the stage 31; an SOG (Spin-on-Glass) liquid exhaust nozzle 33 which applies a thin film coating liquid such as an SOG liquid; a cleaning liquid exhaust nozzle 34 which discharges a cleaning liquid toward peripheral portions of the sheet films F for edge rinsing; and a splashing preventing cup 35 which prevents splashing of the coating liquid, the cleaning liquid and the like around the coating unit 3.

A plurality of suction holes not shown are formed in the entire top surface of the stage 31 and connected with a vacuum pump (not shown). After the sheet film F is transported by the hand-for-film 25 from the film supplying unit 7 to the coating unit 3 and placed on the stage 31 in the manner described above, the vacuum pump operates, whereby the sheet film F is firmly vacuum-sucked to the stage 31. The splashing preventing cup 35 surrounds the stage 31 which has such a structure.

In the coating unit 3 which has such a structure, as the sheet film F is set to the stage 31 and preparation for coating completes, a motor (not shown) disposed in the coating unit 3 operates and the rotation axis 32 starts rotating as shown in FIG. 10. The rotations make the stage 31 and hence the sheet film F rotates about a rotation axis AX4. At the same time as or in a slight delay from the rotations, the SOG liquid exhaust nozzle 33 supplies the SOG liquid toward the center point of the sheet film F. Because of centrifugal force developed by the rotations of the sheet film F, the SOG liquid spreads as a thin film from the center point of the sheet film F over the entire surface. At this stage, the SOG liquid splashing beyond the sheet film F is discharged to outside the coating unit 3 through the splashing preventing cup 35 and further through a discharge duct not shown.

After the SOG liquid is supplied to the entire surface of the sheet film F, edge rinsing is performed. That is, the cleaning liquid is expelled toward the peripheral portion of the sheet film F from the cleaning liquid exhaust nozzle 34. Since the sheet film F is still rotating, the coating liquid adhering to the peripheral portion of the sheet film F is removed owing to the rotations.

As the coating of the sheet film F completes in this manner, the hand-for-film 25 enters the coating unit 3 and sucks to hold the sheet film F While the vacuum pump stops and the vacuum suction by the stage 31 is released. The hand-for-film 25 unloads the sheet film F now seating an SOG film (thin film) from the coating unit 3, and transports the sheet film F to the next processing unit, namely, the drying unit 4.

While the SOG liquid is used as the coating liquid in the coating unit 3 according to this embodiment, the coating liquid is not limited particularly to any but may be a coating liquid which forms a thin film which is to be disposed on the substrate W, such as a photoresist liquid or the like used for lithographic processing of semiconductors. In addition, although the sheet film F is transported to the drying unit 4 which will be described next and drying is performed after the coating process in this embodiment, the sheet film F is transported directly to the transfer unit 5 without performing the drying process.

E. Drying Unit 4

Figure 11:
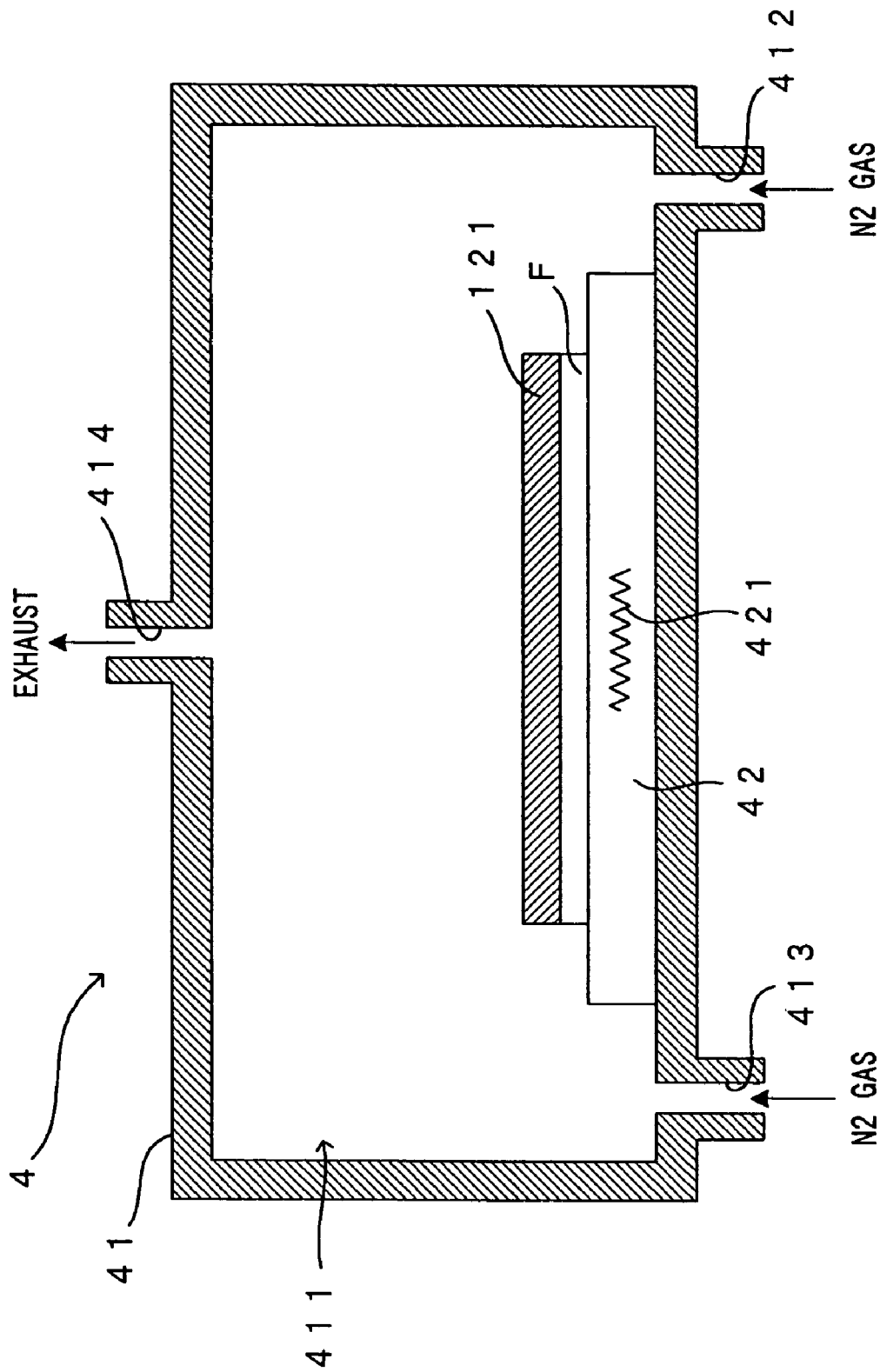
FIG. 11 is a drawing which shows a drying unit which is disposed to the thin film forming apparatus shown in FIG. 1.

FIG. 11 is a drawing which shows the drying unit which is disposed to the thin film forming apparatus shown in FIG. 1. The drying unit 4 comprises: a processing container 41 whose inside is a processing chamber 411; and a hot plate (stage) 42 which is disposed in an inner bottom portion of the processing chamber 411. Denoted at 121 in FIG. 11 is the SOG film (thin film) which is formed on the surface of the sheet film F by the coating unit 3 described above.

There are two nitrogen gas inlets 412 and 413 disposed in a bottom portion of the processing container 41, and a nitrogen gas (N2 gas) is supplied into the processing chamber 411 through the inlets 412 and 413 from a nitrogen gas supply source not shown. An exhaust vent 414 is disposed to a ceiling portion of the processing chamber 411, so that it is possible to discharge gas components within the processing chamber 411 from the processing chamber 411. Hence, the processing chamber 411 is filled with a nitrogen gas atmosphere in which the drying process will be carried out.

The hot plate 42 incorporates a heater 421, and the heater 421 develops heat in response to an electric signal which is fed from the control unit. A plurality of suction holes not shown are formed in the entire top surface of the hot plate 42 and connected with a vacuum pump (not shown), which is similar to the stage 31 of the coating unit 3. As described earlier, after the sheet film F is transported by the hand-for-film 25 to the drying unit 4 and placed on the hot plate 42, the vacuum pump operates, whereby the sheet film F is firmly vacuum-sucked to the hot plate 42. The drying process is initiated, with the sheet film F vacuum-sucked to the hot plate 42.

As the sheet film F is heated for a predetermined period of time and the drying process completes, the hand-for-film 25 enters the drying unit 4 and sucks to hold the sheet film F. While the vacuum pump stops and the vacuum suction by the hot plate 42 is released. The hand-for-film 25 unloads the sheet film F thus dried from the drying unit 4, and transports the sheet film F to the next processing unit, namely, the transfer unit 5.

F. Transfer Unit 5

Figure 12:
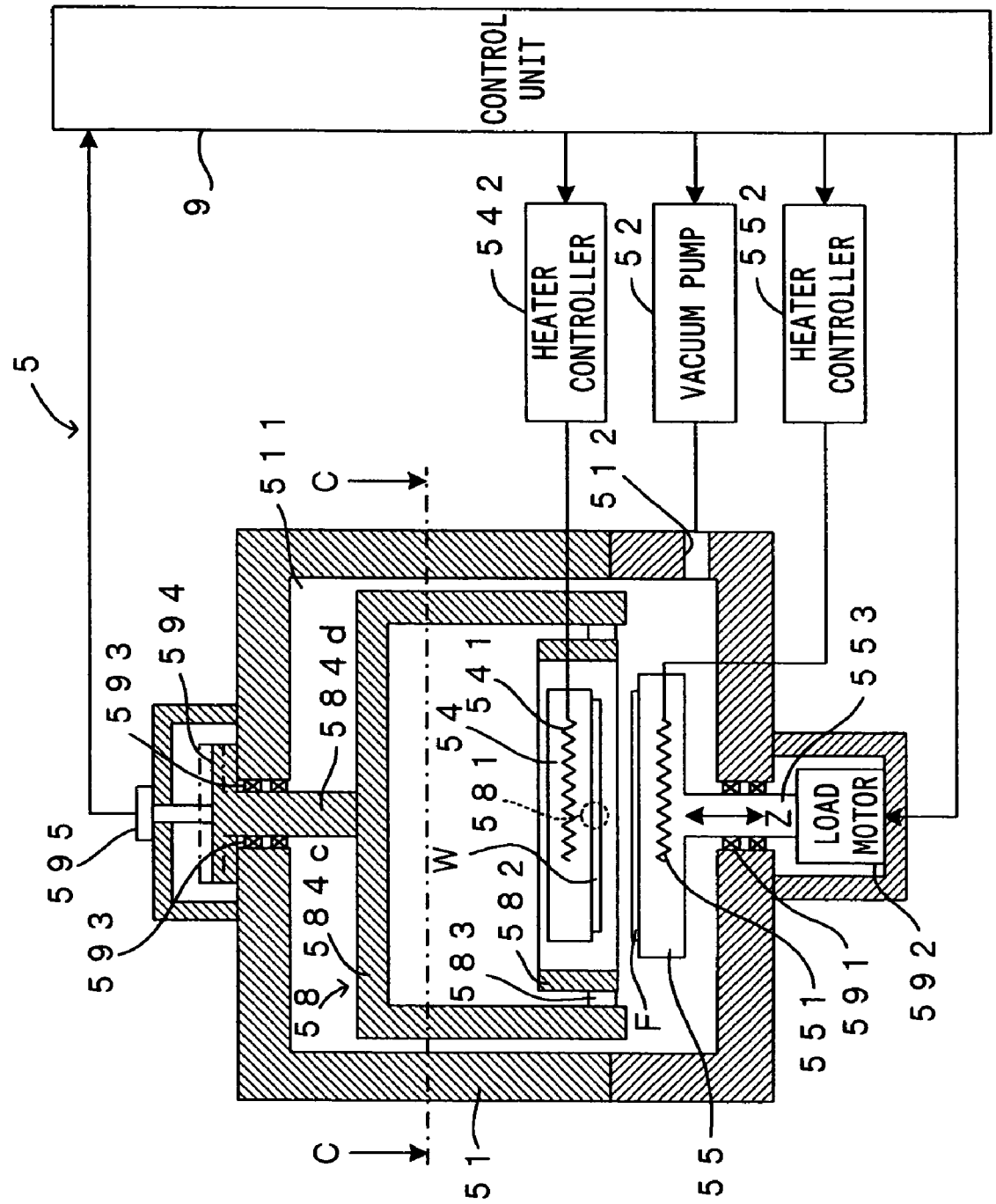
FIG. 12 is a schematic cross sectional view of a transfer unit which is disposed to the thin film forming apparatus shown in FIG. 1.

FIG. 12 is a schematic cross sectional view of the transfer unit which is disposed to the thin film forming apparatus shown in FIG. 1. In FIG. 12, it is possible to vacuum-exhaust the inside of the transfer unit 5, and the transfer unit 5 comprises a processing container 51 which defines a chamber 511 in which the SOG film (thin film) is transferred. An exhaust vent 512 is disposed in a side surface portion of the processing container 51, and a vacuum pump 52 is connected with the exhaust vent 512. The vacuum pump 52, being electrically connected with a control unit 9 which controls the apparatus as a whole, is capable of operating in accordance with an operation instruction from the control unit 9 and accordingly vacuum-exhausting the inside of the chamber 511 through the exhaust vent 512.

Disposed inside the chamber 511 are a first and a second plates 54 and 55, and a mechanism (hereinafter referred to as "tilt correction mechanism") 58. The tilt correction mechanism 58 automatically corrects tilting of the first plate 54 with respect to the second plate 55. The tilt correction guarantees equi-pressure pressing of the substrate W at the entire surfaces of the substrate W and the SOG film which is formed on the sheet film F.

The first plate 54 is hung above the second plate 55 via the tilt correction mechanism 58 in such a manner that the axes of the plates match with each other. As the substrate W is mounted to a surface (bottom surface) of the first plate 54 faced with the second plate 55, the first plate 54 serves as a plate-for-substrate. Hence, a quartz plate (not shown) polished for the evenness is disposed to the bottom surface of the first plate 54 and the substrate W is fixed to the quartz plate. The reason of using the quartz plate is because quartz is excellent as a material to which the substrate W is mounted owing to properties of quartz that quartz does not contain a substance which contaminates the substrates W, the workability of quartz is favorable and therefore a necessary level of evenness is easily obtained, etc. The first plate 54 comprises a heater 541 as heating means inside the first plate 54. The heater 541 is electrically connected with a heater controller 542. Controlled by the heater controller 542 which operates based on substrate temperature information received from the control unit 9, the heater 541 heats between 25 through 300° C.

Another plate, namely the second plate 55, is disposed below the first plate 54, and as the sheet film F is mounted to the top surface of the second plate 55, the second plate 55 serves as a plate-for-film. Further, the second plate 55 comprises a quartz stage on which the sheet film F is placed and a heating stage which heats up the sheet film F. A heater 551 is incorporated as heating means inside the heating stage. The heater 551 is electrically connected with a heater controller 552. Controlled by the heater controller 552 which operates based on substrate temperature information received from the control unit 9, the heater 552 heats between 25 through 300° C. An axis 553 is integrated with the bottom surface center of the heating stage in such a manner that the axis 553 is upright with respect to the bottom surface center of the heating stage. The axis 553 is axially supported by a bearing 591 for free vertical movements and vertically moved along the traveling direction Z by a load motor 592 which serves as a load mechanism.

Figure 13:
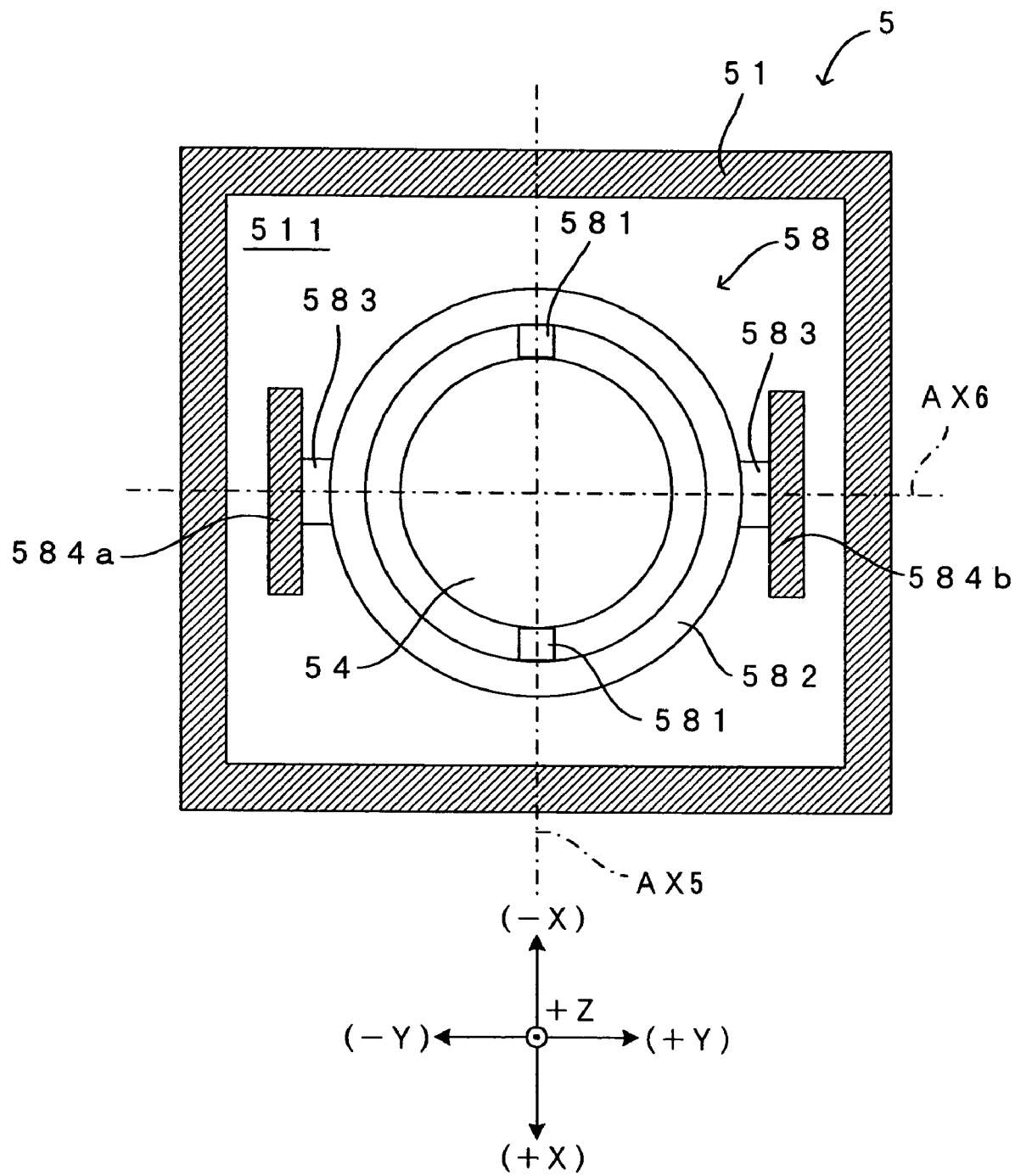
FIG. 13 is a cross sectional view of FIG. 12 taken along the C-C line.
Figure 14:
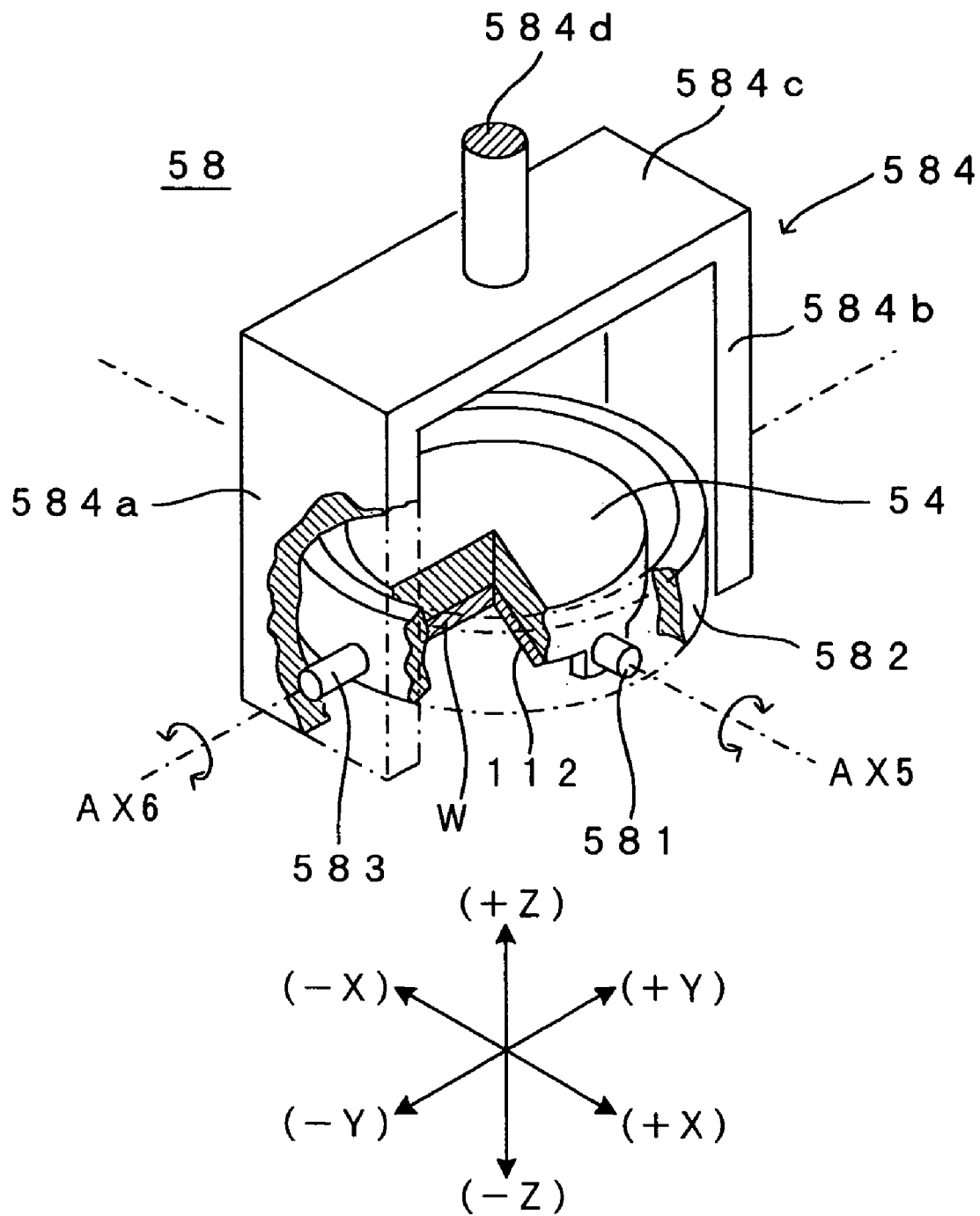
FIG. 14 is a partially notched perspective view of a tilt correction mechanism that is disposed to the transfer unit shown in FIG. 12.

A structure of the tilt correction mechanism 58 will now be described in detail with reference to FIGS. 12 through 14. FIG. 13 is a cross sectional view of FIG. 12 taken along the C-C line. FIG. 14 is a partially notched perspective view of the tilt correction mechanism. In this embodiment, the tilt correction mechanism 58 is disposed as if to surround the periphery of the first plate 54. The tilt correction mechanism 58 comprises a ring-shaped first supporting member 582 and a second supporting member 584. The first supporting member 582 is linked to the first plate 54 through a first axial member 581 extending in a first direction X approximately perpendicular to the traveling direction Z. And the first supporting member 582 supports the first plate 54 for free revolutions about a first revolution axis AX5. Another supporting member 584 is disposed around the first supporting member 582 and linked to the first supporting member 582 through a second axial member 583 extending in a second direction Y approximately perpendicular to the traveling direction Z and the first direction X. And the second supporting member 584 supports the first supporting member 582 for free revolutions about a second revolution axis AX6. In this embodiment, as shown in FIG. 14, the respective axial members 581 and 583 are disposed so as to position the first and the second revolution axes AX5 and AX6 within the surface of the substrate W which is mounted to the first plate 54, that is, within the plane of the thin film bearing surface 112.

In the tilt correction mechanism 58 having such a structure, the first plate 54 is supported for free revolutions about the first revolution axis AX5 while the second plate 55 is supported for free revolutions about the second revolution axis AX6, and the first plate 54, when axially revolving, can tilt with respect to the traveling direction Z.

Further, as shown in FIG. 14, the second supporting member 584 of the tilt correction mechanism 58 comprises two columns 584a and 584b and a beam 584c. The two columns 584a and 584b extend in the direction Z as if to sandwich the first supporting member 582 in the Y-direction. The beam 584c links upper portions of the columns 584a and 584b to each other. A pole 584d extends toward above from a central portion of the beam 584c, and is hung within the chamber 511. More particularly, the pole 584d is pivotally supported by a bearing 593 for free vertical movements, and a flange 594 which prevents dropping toward below is integrated with and protrudes from a top edge of the pole 584d. Denoted at 595 in FIG. 12 is a load sensor which is disposed to correspond to the flange 594. The sensor 595 detects a load applied between the substrate W and the sheet film F and supplies a load value to the control unit 9.

The sequence of transfer using the transfer unit 5 described above will now be described. In this embodiment, the substrate W is transported to the transfer unit 5 from the reversing unit 8 which will be described later. Among transporting the substrate W, it is with the thin film bearing surface 112 (a surface in which electrode interconnections and the like are formed and on which the thin film is to be formed) directed toward below and it is mechanically held by the substrate supporting blocks 245 of the hand-for-substrate 24. Furthermore, the substrate W is mounted to the bottom surface of the first plate 54 with the thin film bearing surface 112 thereof directed to below. The sheet film F, on which surface the SOG film 121 (FIG. 11) is formed by the coating unit 3 in advance, is mounted on the second plate 55 with the SOG film 121 directed to above. The control unit 9 controls the respective portions of the apparatus in the manner described below, whereby the thin film on the substrate W is transferred onto the substrate W.

First, the heater controller 542 energizes the heater 541, thereby heating the first plate 54 and accordingly heating the substrate W to a desired temperature. Meanwhile, the heater controller 552 energizes the heater 551, thereby heating the second plate 55 and accordingly heating the sheet film F to a desired temperature.

Further, the vacuum pump 52 vacuum-evacuates the chamber 511 to a desired level of vacuum. After the inside of the chamber 511 reaches the desired level of vacuum, the control unit 9 sends a drive signal to the load motor 592 and starts loading. Hence, the second plate 55 moves upward along the traveling direction Z and pushes the sheet film F against the substrate W. At this stage, the first plate 54 and the tilt correction mechanism 58 are pushed upward as one unit by the second plate 55.

During the pushing proceeds, when the first plate 54 tilts with respect to the second plate 55, as the second plate 55 abuts on the first plate 54, the tilt correction mechanism 58 automatically corrects the tilt of the first plate 54. In other words, since the first plate 54 is held by the tilt correction mechanism 58 in such a manner that the first plate 54 can tilt with respect to the traveling direction Z, assuming that the first plate 54 is at a small angle toward the left-hand side in FIG. 12 for instance, the left-hand edge side of the second plate 55 first contacts the first plate 54 and pushes up the first plate 54. Hence, the first plate 54 revolves clockwise about the first revolution axis AX5 which exists within the surface of the substrate W, thereby gradually increasing the contact surface between the substrate W and the sheet film F toward the right-hand side. When the tilt of the first plate 54 is completely corrected and the first plate 54 becomes parallel to the second plate 55, the substrate W and the sheet film F are pushed against each other at the equal pressure in the entire surface.

As the load motor 592 continues applying the load and the load sensor 595 senses out a predetermined load, the control unit 9 controls the load motor 592 so that the load motor 592 will continue applying the load for a certain period of time. The heating of the substrate W and the sheet film F to the predetermined temperature continues also during this.

After the series of loading operations described above, the control unit 9 sends a signal to the load motor 592 such that there will be zero loading. At this stage, the control unit 9 also controls such that the vacuum evacuation will be stopped.

Upon completion of the transfer of the SOG film 121 onto the substrate W in the transfer unit 5 as described above, the substrate W is already one integrated unit with the sheet film F with the SOG film (thin film) inserted between the substrate W and the sheet film F. And the substrate W is sucked and accordingly held as it is one integrated unit at the suction holes 246 through 248 of the hand-for-substrate 24 which comes into the transfer unit 5. In short, utilizing the lower side holding mechanism of the hand-for-substrate 24, a tightly adhered object (which is denoted at the reference symbol M in FIG. 15 which will be described later, and which is the substrate W and the sheet film F tightly adhering to each other through the SOG film 121) is sucked and accordingly held. The hand-for-substrate 24 transports the tightly adhered object, as it is sucked and accordingly held, from the chamber 511 to the peeling unit 6.

G. Peeling Unit 6

Figure 15:
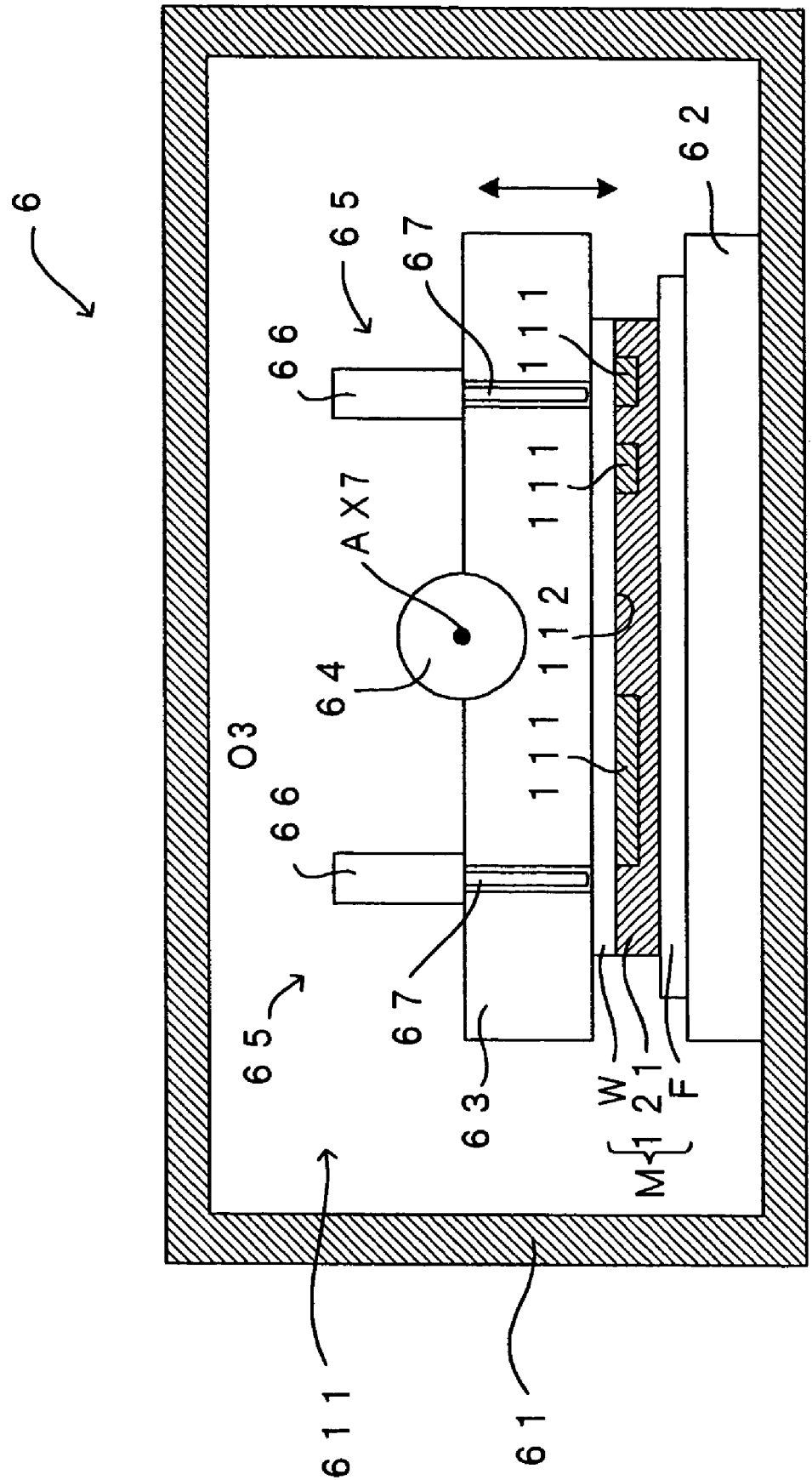
FIG. 15 is a drawing which shows a peeling unit which is disposed to the thin film forming apparatus shown in FIG. 1.

FIG. 15 is a drawing which shows the peeling unit which is disposed to the thin film forming apparatus shown in FIG. 1. The peeling unit 6 comprises: a processing container 61 whose inside is a processing chamber 611; a suction plate 62 which is disposed below the processing chamber 611 and vacuum-sucks the sheet film F of the tightly adhered object M created in the transfer unit 5 described above; and a substrate suction body 63 which is disposed above the suction plate 62, capable of sucking the substrate W of the tightly adhered object M which is placed on the suction plate 62, and revolves about an axis AX7 which is along the X-direction. Denoted at 111 in FIG. 15 are electrode interconnections which are formed in the thin film bearing surface 112 of the substrate W.

A revolving mechanism 64 using a rotary-type air cylinder or the like is connected with the substrate suction body 63, for the purpose of revolving the substrate suction body 63 about the axis AX7. In addition, an elevating mechanism 65 is disposed to the substrate suction body 63.

The elevating mechanism 65 comprises pins 67 which are moved forward and backward by driving members 66 such as air cylinders relative to the contact surface with the substrate W within the substrate suction body 63. When the substrate suction body 63 revolves and directs the substrate W toward above, the pins 67 are moved upward, thereby making it possible to move the substrate W to above the substrate suction body 63.

An ionizer not shown is disposed to the processing chamber 611 of the processing container 61, so that it is possible to develop an ozone ($O_3$) atmosphere inside the processing chamber 611.

Operations of the peeling unit 6 having such a structure described above will now be described. The substrate W to which the sheet film F is bonded by the transfer unit 5 with the SOG film 121 inserted between the substrate W and the sheet film F, namely, the tightly adhered object M is loaded into the processing chamber 611 of the peeling unit 6, while sucked and accordingly held by the hand-for-substrate 24 of the center robot 2. At this stage, the substrate suction body 63 has already retracted to above. After placing the tightly adhered object M on the suction plate 62 in such a manner that the sheet film F contacts the suction plate 62, the hand-for-substrate 24 retracts outside the processing container 61.

While the suction plate 62 sucks the sheet film F, the substrate suction body 63 moves downward and sucks the substrate W at the back surface (no-thin-film surface) of the substrate W. Meanwhile, the processing container 61 is closed air tight and the ionizer is activated, and the processing chamber 611 is accordingly filled with an ozone atmosphere. With the sheet film F sucked in this manner, a solvent contained in the SOG film 121 is discharged through the sheet film F, so that the SOG film 121 is dried. This drying process facilitates drying and hence peeling of the SOG film 121 more at the interface between the sheet film F and the SOG film 121 than at the interface between the substrate W and the SOG film 121. When the substrate suction body 63 moves upward after a predetermined period of time, peeling occurs at the interface between the sheet film F and the SOG film 121 and the SOG film 121 is consequently transferred onto the substrate W from the sheet film F.

Next, the substrate suction body 63 which has moved to above is revolved by the revolving mechanism 64 about the axis AX7 and stops as the thin film bearing surface 112 of the substrate W gets directed upward and assumes a horizontal posture, that is enters a face-up condition. Following this, the substrate suction body 63 releases suction of the substrate W and the elevating mechanism 65 then moves the substrate W to above. In short, as the driving members 66 raise the pins 67, the substrate W is raised off from the surface of contact with the substrate suction body 63.

The hand-for-substrate 24 transports thus raised substrate W to the next processing unit, namely, the reversing unit 8, and the substrate transporting robot 12 of the indexer ID houses the substrate W into the substrate cassette 11.

H. Reversing Unit 8

FIGS. 16A and 16B are drawings which show the reversing unit which is disposed to the thin film forming apparatus shown in FIG. 1, of which FIG. 16A is a plan view showing the reversing unit from above and FIG. 16B is a cross sectional view of FIG. 16A taken along the D-D line. The reversing unit 8 comprises paired substrate chucks 81 and 81 which receive and transfer the substrate W from and to the hand-for-substrate 24 of the center robot 2. The substrate chucks 81 and 81 are arranged to face yet with a distance with each other. Each substrate chuck 81 is disposed to a front edge portion of a rod 83 of a rotary cylinder 82, moves in the X-direction as the rod 83 moves in the X-direction and rotates 180 degrees about the rod 83 as the rod 83 rotates.

Hence, as the substrate transporting robot 12 of the indexer ID transports the yet-to-be-processed substrate W between the substrate chucks 81 and 81 which are away from each other, the two rods 83 extend and the paired substrate chucks 81 and 81 firmly hold the substrate W as shown in FIGS. 16A and 16B, following which the substrate transporting robot 12 retracts. The both rods 83 then rotate 180 degrees. As a result, the substrate W transported in the face-up condition, i.e., a condition that the electrode interconnections 111 formed in the thin film bearing surface 112 are directed to above, is reversed and enters a face-down condition.

When the substrate W already bearing the thin film is transported by the center robot 2 to the reversing unit 8 from the peeling unit 6 while mechanically held in the face-up condition by the hand-for-substrate 24, the both rods 83 extend and the paired substrate chucks 81 and 81 firmly hold the substrate W, and the substrate is handed over to the substrate transporting robot 12 without getting reversed.

I. Operations

Figure 17:
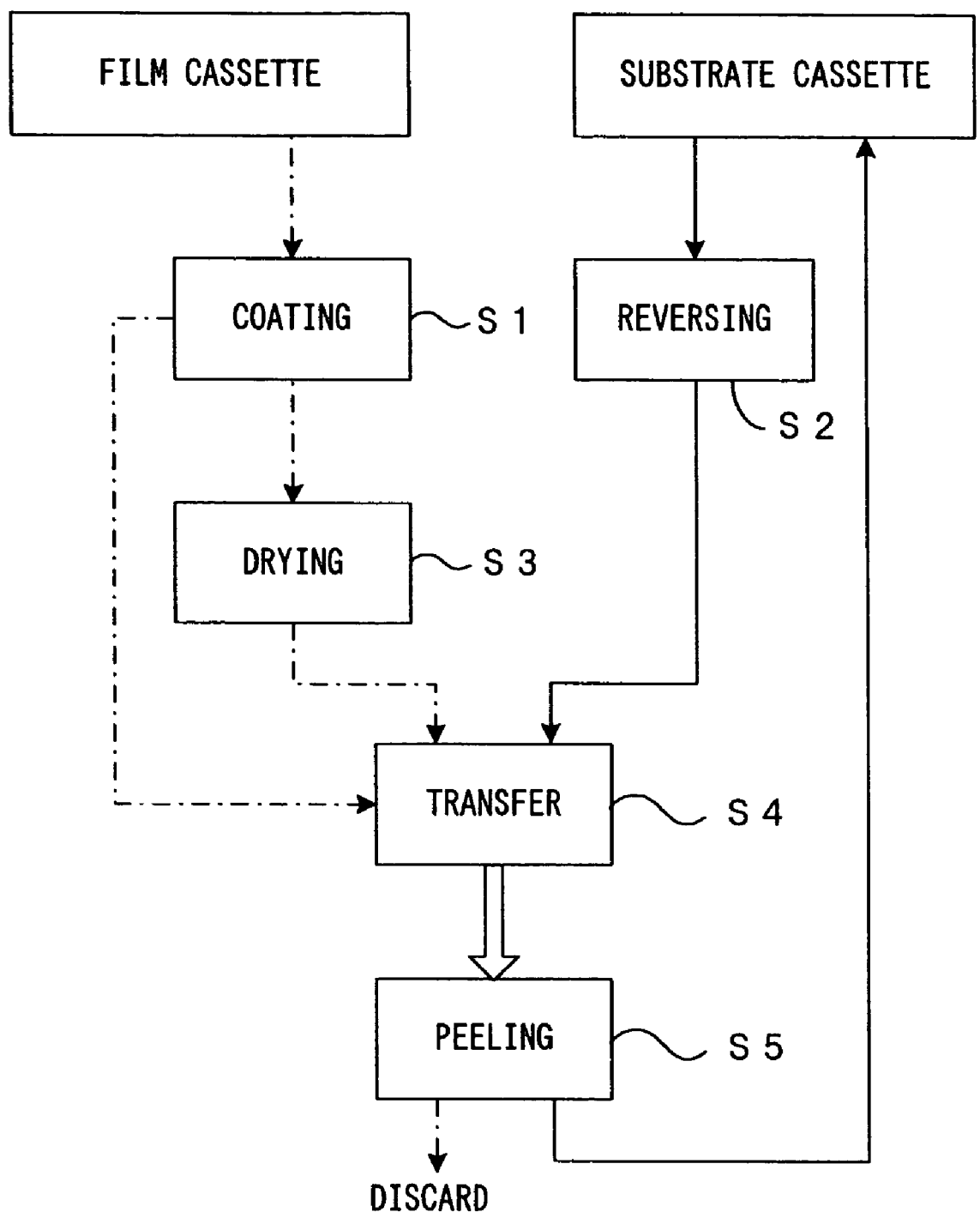
FIG. 17 is a drawing which shows overall operations of the thin film forming apparatus shown in FIG. 1.
Figure 18A:
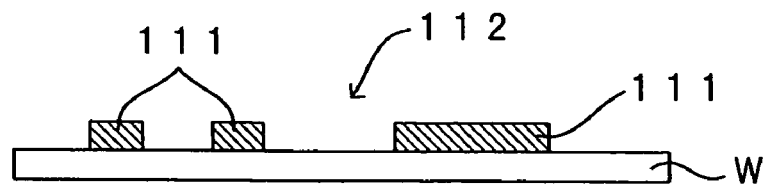
FIGS. 18A through 18D are drawing which shows the sequence of forming a thin film in a conventional thin film forming apparatus.
Figure 18B:
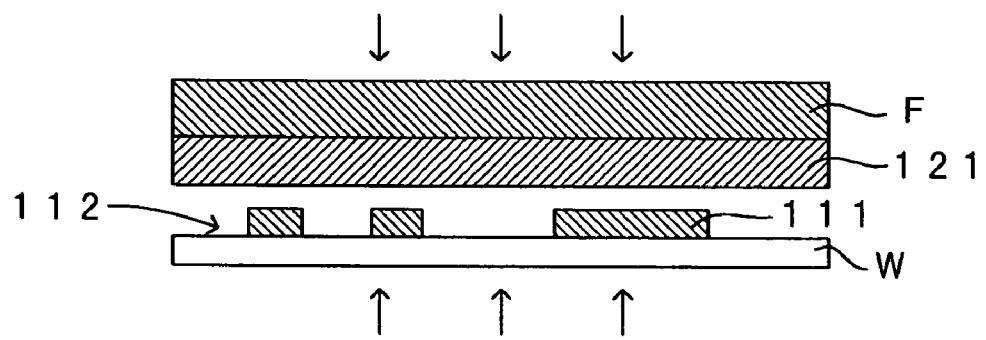
Figure 18C:
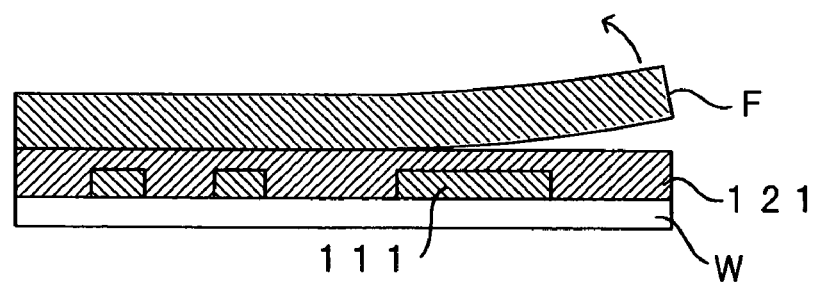
Figure 18D:
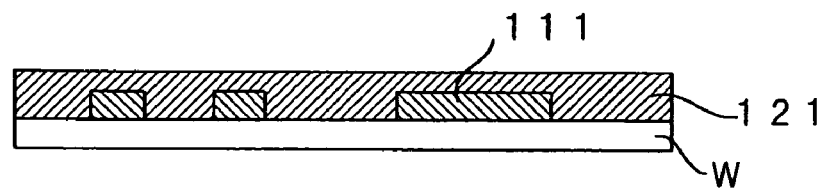

FIG. 17 is a drawing which shows overall operations of the thin film forming apparatus having such a structure described above. In FIG. 17, the solid line arrows denote the order in which the substrate W is transported, the dotted line arrows denote the order in which the sheet film F is transported, and the white arrow denotes transportation of the tightly adhered object M. In this thin film forming apparatus, the substrate W which seats the electrode interconnections 111 on the surface of the substrate W is housed in the substrate cassette 11, while the sheet film F is housed in the film cassette 71. The hand-for-film 25 transports the top-most sheet film F of the film cassette 71 to the coating unit 3, and the SOG film 121 is applied upon the surface of the sheet film F (Step S1: Coating). In the event that the top-most one in the film cassette 71 is the separating sheet SH, the top-most separating sheet SH is removed in accordance with the sequence of operations described above under the section "C. Film Supplying Unit (Film Supplier) 7 and Film Cassette 71" and the sheet film F is positioned in the top-most portion, following which the sheet film F is transported to the coating unit 3 and the coating unit 3 performs the coating process as described above.

Parallel to the unloading of the sheet film F and the coating process, in the indexer ID, the substrate transporting robot 12 takes out the substrate W which is housed in the substrate cassette 11 while maintaining the substrate W in the face-up condition, and transports the substrate W to the reversing unit 8. The reversing unit 8 then reverses the substrate W into the face-down condition (Step S2: Reversing). The substrate supporting blocks 245 of the hand-for-substrate 24 receives the substrate W from the reversing unit 8, and the substrate W is transported to the transfer unit 5 and mounted to the bottom surface of the first plate 54 of the transfer unit 5. In this manner, the upper side holding mechanism of the hand-for-substrate 24 holds the substrate W and transports the substrate W from the reversing unit 8 to the transfer unit 5 in this embodiment.

Meanwhile, as the coating process completes, the hand-for-film 25 transports the sheet film F from the coating unit 3 to the drying unit 4, and the SOG film 121 on the sheet film F is dried in the drying unit 4 (Step S3: Drying). When the drying process is not necessary, the hand-for-film 25 transports the sheet film F from the coating unit 3 directly to the transfer unit 5 and the sheet film F is mounted on the second plate 55.

As the substrate W and the sheet film F are set to the first and the second plates 54 and 55 respectively in the transfer unit 5, the SOG film 121 is transferred onto the substrate W in accordance with the sequence of operations described above under the section "F. Transfer Unit 5" (Step S4: Transfer).

Next, the hand-for-substrate 24 enters the transfer unit 5, and after the substrate W is sucked and accordingly held on the bottom surface side of the hand main body 243, the tightly adhered object M as it is sucked in this manner is transported to the peeling unit 6. Thus, the lower side holding mechanism of the hand-for-substrate 24 is used for transportation of the tightly adhered object M from the transfer unit 5 to the peeling unit 6.

The sheet film F alone is selectively peeled off from the tightly adhered object M thus transported to the peeling unit 6 (Step S5: Peeling). This generates the substrate W which seats only the SOG film 121 on the thin film bearing surface 112. This substrate W, while held in the face-up condition by the substrate supporting blocks 245 of the hand-for-substrate 24, is transported to the reversing unit 8. In other words, transportation of the substrate W is carried out using the upper side holding mechanism of the hand-for-substrate 24. Meanwhile, the sheet film F thus peeled off is discarded.

In the indexer ID, the substrate W now bearing the thin film and returned to the reversing unit 8 is housed by the substrate transporting robot 12 in the substrate cassette 11.

J. Functions and Effects

As described above, this embodiment realizes the following functions and effects.

(1) In the thin film forming apparatus having such a structure described above, in the process part PP, the thin film is formed on the substrate W utilizing the sheet film F while the center robot 2 which functions as "transporting means" of the present invention transports the sheet film F and/or the substrate W between the coating unit (coating means) 3, the drying unit (drying means) 4, the transfer unit (transfer means) 5 and the peeling unit (peeling means) 6. Hence, it is possible to form the thin film using the sheet film F without involving an operator. Further, since the film supplying unit (film supplying means/film supplier) 7 is disposed to the process part PP and the sheet film F is supplied directly to the process part PP, it is possible to enhance the efficiency of transporting the sheet films F and improve the throughput of the apparatus.

(2) The center robot 2 is fixed approximately in the central portion of the process part PP. The coating unit (coating means) 3, the drying unit (drying means) 4, the transfer unit (transfer means) 5, the peeling unit (peeling means) 6, the film supplying unit (film supplying means/film supplier) 7 and the reversing unit 8 are arranged around the center robot 2. The hand-for-substrate 24 and the hand-for-film 25 are allowed to directly access the respective units 3 through 8. Hence, it is not necessary to install a transportation path for the center robot 2, which is advantageous to size reduction of the apparatus.

(3) The center robot 2 comprises the upper side holding mechanism and the lower side holding mechanism and is therefore capable of transporting the substrate W while holding the substrate W in the two holding conditions. The holding condition is switched depending on the state of the substrate W in the embodiment described above. Hence, the center robot 2 is adaptable to the state of the substrate W and capable of efficiently transporting the substrates.

(4) The transfer means which transfers the SOG film 121 on the sheet film F onto the thin film bearing surface 112 may be various types of apparatuses proposed according to conventional techniques, such as the apparatus described in Japanese Patent Application Laid-Open No. 2001-135634, instead of using the transfer unit 5 according to the embodiment described above. However, in this embodiment, the tilt correction mechanism 58 is the transfer unit 5, as described earlier in detail under the section "E Transfer Unit 5," in which the first plate 54 can be tilted with respect to the vertical direction Z by axial revolutions about the two revolution axes AX5 and AX6. Hence, it is possible to dispose the drying unit 4 and the transfer unit 5 one atop the other as shown in FIG. 1 and therefore to reduce the area size for installation of the thin film forming apparatus, namely, the footprint. The reason is as described below. That is, a conventional approach for pressing the substrate W on the entire surface of the substrate W against the sheet film F with a uniform pressure is to incorporate, in a transfer unit, the tilt correction mechanism described in the official gazette mentioned above for example, namely, a mechanism which revolves a first plate along spherical surfaces of a convex plate and a concave plates for correction of tilt. However, this conventional approach has a problem that the size of the mechanism is large in the vertical direction Z, because of which it is practically difficult to stack the transfer unit and the drying means one atop the other. On the contrary, as for the transfer unit according to this embodiment, the height of the transfer unit 5 is remarkably lower than the conventional transfer unit, which makes it possible to overlap the drying unit 4 and the transfer unit 5 in the vertical direction and accordingly reduce the footprint.

(5) Since the sheet films F as they are with the separating sheets SH inserted between the sheet films F are housed in the film cassette 71, it is possible to prevent the sheet films from adhering air-tight to each other and use the respective sheet films F separately without fail. As the separating sheet SH is located at the very top in the film cassette 71, it is possible to effectively prevent contamination of the sheet film F. Further, since the separating sheet removing mechanism 74 is disposed and the separating sheet SH at the very top is removed in this embodiment, it is possible to position the sheet film F at the very top in the film cassette 71 and easily take out the sheet film from the film cassette 71. This in turn makes it possible to supply the sheet films F in accordance with the necessity without involving an operator and thus efficiently supply the sheet films F. The sheet film F is an object made of a resin and shaped as a thin plate or thin film. The separating sheet SH is an object shaped as a thin plate or thin film which is placed between the sheet films F for the purpose of protecting the sheet films F and suppressing electrification. A preferable material is a clean paper considering suppression of electrification, dust, etc., but other materials such as papers and resins may be used.

(6) Since the film cassettes 71 are freely attachable to and detachable from the thin film forming apparatus, as the film cassettes 71 housing the sheet films F in advance are prepared and mounted to the apparatus in accordance with a necessity, it is possible to supply the sheet films F. This realizes even more efficient supplying of the sheet films F.

(7) With the inner space 254 created inside the hand-for-film 25 under a negative pressure using the blower, the hand-for-film 25 sucks and accordingly holds the sheet film F, that is, an exhaust flow rate is increased and a negative pressure is applied upon the suction holes. Hence, even if there is a leakage locally in the exhaust path from the suction holes 246 through 248 to the blower, it is possible to develop a sufficient negative pressure to suck and accordingly hold the sheet film F although the negative pressure decreases in an amount equivalent to the leakage. It is thus possible to transport the sheet films F with excellent stability, and therefore, to efficiently transport the sheet films.

K. Others

The present invention is not limited to the preferred embodiment described above but may be modified to the extent not deviating from the intention of the invention. For instance, although the preferred embodiment above requires that the respective units 3 through 8 are radially arranged about the center robot 2 as shown in FIG. 1, the arrangement of the center robot 2 and the respective units 3 through 8 is not limited to this. Instead, the respective units 3 through 8 may be arranged on the both sides or one side to a predetermined transportation path for the center robot 2 which is allowed to freely move along the transportation path.

In addition, while the preferred embodiment above uses the coating unit 3 for the coating process, the drying unit 4 for the drying process, the transfer unit 5 for the transfer process and the peeling unit 6 for the peeling process as units which processes the sheet films F, in addition to these units, other processing unit, such as a hydrophilic process unit which subjects the sheet films F to a hydrophilic surface treatment, may be further disposed or some of these units may be deleted. Thus, the present invention is applicable to thin film forming apparatuses in general which comprise a unit which handles the sheet films F.

Further, although the transfer unit 5 which corresponds to the transfer means and the peeling unit 6 which corresponds to the peeling means are separate units from each other according to the preferred embodiment described above, the present invention may be applied to thin film forming apparatuses comprising a unit which serves both as the transfer means and the peeling means instead of using these units 5 and 6.

Still further, although the drying unit 4 is stacked above the transfer unit 5 along the vertical direction Z in the preferred embodiment described above, the drying unit 4 may be stacked above other processing unit or arranged stand alone. In the event that the drying unit 4 is arranged stand alone, a plurality of drying unit 4 may all be stacked up. The drying unit 4 may be omitted of course, if the drying process is not necessary.

The center robot 2 is equipped with the two holding conditions, characterized in transporting the substrate W while switching the holding condition in accordance with the substrate W and transporting the two substrates W at the same time, and thus, corresponds to a transport mechanism of the present invention. While the center robot 2 is applied to a thin film forming apparatus so as to make use of such a characteristic in the preferred embodiment described above, the transport mechanism of the present invention may be applied to apparatuses in general which involves transportation of substrates. This realizes the effect (3) described above, i.e., an effect that the transport mechanism is adaptable to the state of the substrate W and capable of efficiently transporting substrates.

In addition, the present invention is suitable to processing in which a thin film is joined under pressure without creating a space in a concave portion of a substrate which comprises concave and convex patterns and a surface of the thin film is made planar. An examples is a situation that an SOD (Spin-on-Dielectric) film, an SOG film or the like is formed as an inter-layer insulation film on a substrate which comprises an interconnection pattern of metal or the like, or a situation that a conductive thin film is buried in a substrate which comprises a hole, such as a contact hole, a groove-shaped element, etc.

Further, the present invention is applicable to generation of a thin film on a substrate, such as a glass substrate for semiconductor wafer, liquid crystal panel or the like, a glass substrate for photomask, a glass substrate for plasma display and a substrate for optical disk, and fabrication of an IC card, a solar battery device, etc.

Although the invention has been described with reference to specific embodiments, this description is not meant to be construed in a limiting sense. Various modifications of the disclosed embodiment, as well as other embodiments of the present invention, will become apparent to persons skilled in the art upon reference to the description of the invention. It is therefore contemplated that the appended claims will cover any such modifications or embodiments as fall within the true scope of the invention.

What is claimed is:

1. A transport mechanism which transports a substrate while holding said substrate, comprising:
   a hand main body which is provided with a plurality of suction holes which are formed in a central portion of a bottom surface of said hand main body;
   an upper side holding mechanism which includes a substrate supporting member which is provided on a top surface side of said hand main body and supports said substrate to hold said substrate mechanically;
   a lower side holding mechanism which applies suction to hold said substrate via said plurality of suction holes; and
   a driver-for-substrate which moves said hand main body so as to transport said substrate;
   wherein said driver-for-substrate includes a drive main body and an arm which is movable and is attached to said drive main body, and
   wherein a rear edge portion in the longitudinal direction of said hand main body is disposed at a front edge of said arm.

2. The transport mechanism of claim 1, wherein said substrate supporting member is fixed on a top surface of said hand main body and said substrate fits with said substrate supporting member at an outer side surface of said substrate.

3. The transport mechanism of claim 2, wherein said hand main body includes a top plate and a bottom plate, wherein said top plate is set on said bottom plate and said top and bottom plates are integrated with each other,
   wherein said plurality of suction holes are formed in a central portion of said bottom plate and are arranged in a longitudinal direction of said hand main body,
   wherein said top plate is provided with a groove portion which is formed on a bottom surface side of said top plate and links said plurality of suction holes to each other,
   wherein said upper side holding mechanism includes a substrate supporting block, as said substrate supporting member, which is fixed on a top surface portion of said top plate and with which said substrate fits at an outer side surface of said substrate, and
   wherein said lower side holding mechanism applies a negative pressure upon said groove portion to hold said substrate via said plurality of suction holes.

4. The transport mechanism of claim 1, wherein said hand main body includes a top plate and a bottom plate, wherein said top plate is set on said bottom plate and said top and bottom plates are integrated with each other,
   wherein said plurality of suction holes are formed in a central portion of said bottom plate and are arranged in a longitudinal direction of said hand main body,
   wherein said top plate is provided with a groove portion which is formed on a bottom surface side of said top plate and links said plurality of suction holes to each other,
   wherein said upper side holding mechanism includes a substrate supporting block, as said substrate supporting member, which is fixed on a top surface portion of said top plate and with which said substrate fits at an outer side surface of said substrate, and
   wherein said lower side holding mechanism applies a negative pressure upon said groove portion to hold said substrate via said plurality of suction holes.

* * * * *